United States Patent
Braginsky et al.

(10) Patent No.: US 11,754,655 B2
(45) Date of Patent: Sep. 12, 2023

(54) METHOD AND APPARATUS FOR CALIBRATING A MEASUREMENT DEVICE

(71) Applicant: Solaredge Technologies Ltd., Herzeliya (IL)

(72) Inventors: David Braginsky, Ashdod (IL); Dor Yairi, Tel Aviv (IL); Ilan Yoscovich, Ramat Gan (IL)

(73) Assignee: Solaredge Technologies Ltd., Herzeliya (IL)

(*) Notice: Subject to any disclaimer, the term of this patent is extended or adjusted under 35 U.S.C. 154(b) by 13 days.

(21) Appl. No.: 17/220,430

(22) Filed: Apr. 1, 2021

(65) Prior Publication Data

US 2021/0311153 A1   Oct. 7, 2021

Related U.S. Application Data

(60) Provisional application No. 63/003,994, filed on Apr. 2, 2020.

(51) Int. Cl.
*G01R 35/00* (2006.01)
*G01R 15/18* (2006.01)
*G01R 19/00* (2006.01)

(52) U.S. Cl.
CPC ......... *G01R 35/005* (2013.01); *G01R 15/186* (2013.01); *G01R 19/0092* (2013.01)

(58) Field of Classification Search
CPC ............ G01R 35/005; G01R 15/186; G01R 19/0092; G01R 1/22; G01R 35/02
USPC ........................................................ 324/130
See application file for complete search history.

(56) References Cited

U.S. PATENT DOCUMENTS

| | | | | |
|---|---|---|---|---|
| 2013/0128396 A1* | 5/2013 | Danesh | .................. | G01R 23/02 361/45 |
| 2015/0219691 A1* | 8/2015 | Cook | .................. | G01R 15/183 324/127 |
| 2017/0117877 A1* | 4/2017 | Ha | .................. | H04L 25/12 |
| 2019/0050009 A1* | 2/2019 | Price | .................. | G05F 1/565 |

FOREIGN PATENT DOCUMENTS

| | | | |
|---|---|---|---|
| CN | 204241579 U | * | 4/2015 |
| CN | 204241579 U | | 4/2015 |

OTHER PUBLICATIONS

Jul. 28, 2021—European Search Report—EP 21166661.5.

* cited by examiner

*Primary Examiner* — Tung X Nguyen
*Assistant Examiner* — Robert P Alejnikov, Jr.
(74) *Attorney, Agent, or Firm* — Banner & Witcoff, Ltd.

(57) ABSTRACT

Systems, apparatuses, and methods are described for calibration of a current transformer. In some examples, one or more electrical elements may be affected in order to set a calibration of the current transformer. A calibration circuit of the current transformer may be permanently or non-permanently affected according to a calibration code in order to set the calibration of the current transformer. For example, one or more fuses may be burned to lock in a certain configuration of the current transformer.

20 Claims, 24 Drawing Sheets

METHOD AND APPARATUS FOR CALIBRATING A MEASUREMENT DEVICE

CROSS REFERENCE TO RELATED APPLICATIONS

This application is a non-provisional of and claims priority to U.S. Provisional Patent Application No. 63/003,994, filed Apr. 2, 2020, which is hereby incorporated by reference in its entirety.

BACKGROUND

Current transformers (CTs) are electrical devices that are configured to increase or reduce an electrical parameter, e.g., an alternating current (AC), voltage, etc. CTs may have one or more sets of one or more windings, e.g., primary windings and/or secondary windings. The different sets of windings may each have a different number of windings for that set (e.g., the set of primary windings may have more or less windings than the set of secondary windings, for example, the primary winding may have one winding and the secondary winding may have 100 windings, or vice versa). CTs may be configured to generate current or voltage in the secondary windings that is proportional to current or voltage in the primary windings. CTs may be configured to transform relatively great values of current or voltage to relatively lesser values of current or voltage that may be easier for measuring instruments and protective relays to use. For example, the measuring instruments and/or relays may be configured to obtain and/or monitor relatively lesser current values and/or voltage values.

SUMMARY

The following summary presents a simplified summary of certain features. The summary is not an extensive overview and is not intended to identify key or critical elements.

Systems, apparatuses, and methods are described for calibration of a current transformer.

In some examples, one or more electrical elements may be affected in order to set a calibration of the current transformer. For example, one or more fuses may be burned to lock in a certain configuration of the current transformer. For example, a calibration circuit of the current transformer may be permanently affected according to a calibration code in order to set the calibration of the current transformer according to a certain threshold value (e.g., according to a certain level of accuracy). In some examples, a calibration circuit of the current transformer may be non-permanently affected in order to set the calibration of the current transformer. For example, one or more switches may be actuated (e.g. turned ON or turned OFF) to set a certain configuration of the current transformer.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

Figure 1:
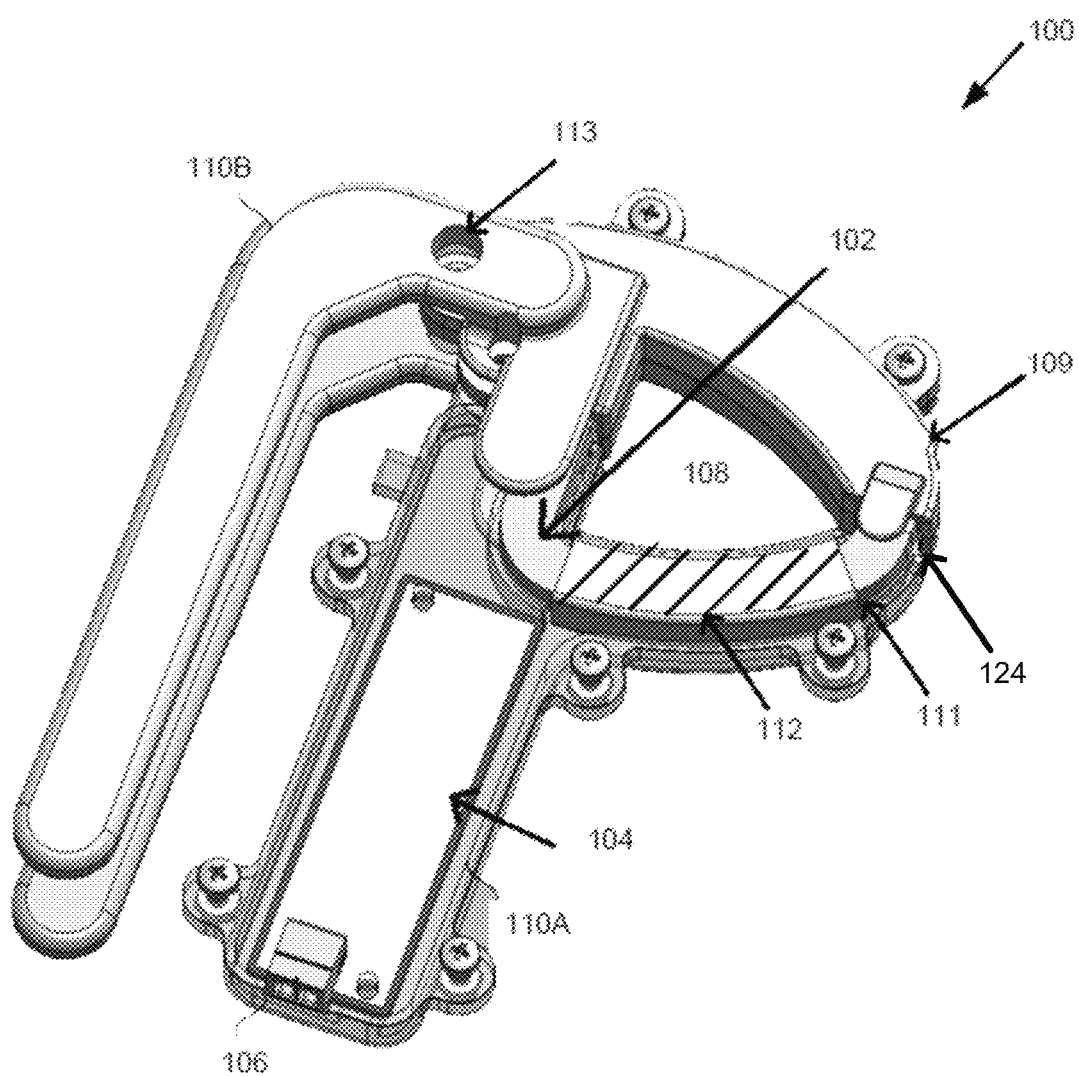
FIG. 1 illustrates an apparatus, in accordance with certain examples of the presently disclosed subject matter.

Systems, apparatuses, and methods are described herein for the calibration of a current transformer. In some examples, one or more electrical elements may be affected in order to set a calibration of the current transformer. These electrical elements may be part of a calibration circuit of the current transformer. One or more of the electrical elements may be permanently or non-permanently affected according to a calibration code in order to set the calibration of the current transformer. The electrical elements may be part of pathways of the calibration circuit. Each of these electrical pathways may be set in a closed circuit configuration or an open circuit configuration using the respective electrical elements of that electrical pathway (e.g., in accordance with the calibration code). For example, one or more fuses of the electrical pathways of the calibration circuit may be burned to lock in a certain configuration of the current transformer (e.g., based on a reference measurement).

Affecting one or more electrical elements or electrical components of a circuit (or circuitry) may include changing an impedance of the component. For example, the component may change from a conducting state to a non-conducting state. For example, the component may change from a non-conducting state to a conducting state. For example, a current may be applied to a fuse (such as one fuse in a bank of fuses) and the heat generated by the current may cause the fuse to melt, thereby changing the fuse from a conducting state to a non-conducting state. The affecting may be used to calibrate a measurement device. When a digital value or an analog value is measured from the bank of fuses, depending on which fuses have been melted (or blown) and which have not been melted (or blown) the measurement device may produce different results. The measurement device may be calibrated by first determining which fuses being blown would provide a relatively accurate measurement, and then blowing those fuses to set the calibration in the bank of fuses of the measurement device. In some examples, a calibration code may represent which fuses should be blown, wherein each fuse represents a bit of the calibration code. In some examples, there may be a summation of voltages each applied to one fuse in the bank of fuses. For example, a first fuse may be connected to a 100 millivolt (my) source, a second fuse may be connected to a 200 mv source, a third fuse may be connected to a 400 mv source, a fourth fuse may be connected to an 800 mv source, a fifth fuse may be connected to a 1.6 volt source, a sixth fuse may be connected to a 3.2 volt source, and so on. For example, by selectively affecting some of the fuses by changing those fuses from a conducting state to a non-conducting state, the voltage can be added from the conducting fuses to achieve an accuracy, such as, a 100 mv accuracy.

Another example of affecting one or more electrical elements or electrical components of a circuit (or circuitry) may be when a current is applied to a component to change the component from a non-conducting state to a conducting state. For example, actuating a switch to switch it from a turned ON (closed circuit) state to a turned OFF (open circuit) state or vice versa. For example, applying a gate voltage to a transistor may change the transistor from a non-conducting state to a conducting state. Not applying a gate voltage to a transistor may change the transistor from a conducting state to a non-conducting state. For example, affecting which switches in a bank of switches are turned ON or turned OFF may change the results of the measurement device. The measurement device may be calibrated by first determining which switches being turned OFF or turned ON would provide a relatively accurate measurement, and then turning OFF or turning ON those switches to set the calibration in the bank of switches of the measurement device. In some examples, a calibration code may represent which switches should be turned OFF or turned ON, wherein each switch represents a bit of the calibration code. Selectively affecting the switches in the bank of switches may be done to calibrate the measurement device and control a voltage output of a calibration circuit. For example, there may be a summation of voltages each applied to one switch in the bank of switches (which may be similar to the example given above with regards to the bank of fuses). For example, by selectively affecting some of the switches by changing those switches from a conducting state to a non-conducting state, a voltage can be added from the conducting switches to achieve an accuracy, such as, a 100 mv accuracy The accompanying drawings, which form a part hereof, show examples of the disclosure. It is to be understood that the examples shown in the drawings and/or discussed herein are non-exclusive and that there are other examples of how the disclosure may be practiced.

It is noted that the teachings of the presently disclosed subject matter are not bound by the systems and apparatuses described with reference to the figures. Equivalent and/or modified functionality may be consolidated or divided in another manner and may be implemented in any appropriate combination. For example, differential amplifier 712 and differential amplifier 714, which are shown as separate units of calibration system 800 (illustrated, for example, in FIG. 7 and FIG. 8), may have their functionalities and/or components combined into a single unit.

It is also noted that the teachings of the presently disclosed subject matter are not bound by the flow charts illustrated in the figures, and the illustrated operations may occur out of the illustrated order. For example, operations 2302 and 2304 that are shown in succession in method 2300 (FIG. 23) may be executed substantially concurrently or in reverse order. It is also noted that while the flow charts are described with reference to elements illustrated herein, this is by no means binding, and the operations may be performed by elements other than those described herein.

It is also noted that like references in the various figures refer to like elements throughout the application. This includes similar references, for example, it is to be understood that CT clamp 100 illustrated in FIG. 1 may be similar to or the same as other CT clamps described and illustrated herein, and vice versa. Although calibration is described for a CT clamp, it will be appreciated that the present subject matter may be applied to other similar measuring devices and/or probes. The term "CT clamp" used herein may include any appropriate measuring device that includes one or more element or mechanism for surrounding a portion of an electrical conductor (e.g., a clamp mechanism that is configured to have both an open configuration and a closed configuration), and includes and/or is connectable to one or more element or mechanism for sensing one or more electrical parameter (e.g., one or more sensor configured to obtain measurements related to current and/or voltage). The CT clamp may also be referred to as a "current clamp" or a "clamp meter". For example, the measurement device may refer to one or more different types of current clamp, such as: CT, iron vane, Hall Effect, Rogowski coil, etc. As another example, the measurement device may be one or more device configured to be calibrated and configured to measure at least one of: current, voltage, power, temperature, etc.

It is also noted that all numerical values given in the examples of the description are provided for illustrative purposes only and are by no means binding.

The terms, "substantially", "about", "sufficient", "efficiently", and, "threshold", used herein include variations that are equivalent for an intended purpose or function (e.g., within a permissible variation range). Certain values or ranges of values are presented herein with numerical values being preceded by the terms "substantially", "about", "sufficient", and, "threshold". The terms "substantially", "about", "sufficient", and "threshold", are used herein to provide literal support for the exact number that it precedes, as well as a number that is near to or approximately the number that the term precedes. In determining whether a number is near to or approximately a specifically recited number, the near or approximating unrecited number may be a number, which, in the context in which it is presented, provides a substantial equivalent of the specifically recited number.

The term "controller" used herein may include a computer and/or other appropriate processing circuitry and memory. The terms "computer" or "processor" or variations thereof should be expansively construed to cover any kind of hardware-based electronic device with data processing capabilities including, by way of non-limiting example, a digital processing device (e.g., digital signal processor (DSP), microcontroller, field programmable circuit, application-specific integrated circuit (ASIC), etc.), a device which comprises or is operatively connected to one or more processing devices, and/or an analog circuit implementing control logic. The terms "memory" or "data storage device" used herein should be expansively construed to cover any volatile or non-volatile computer memory suitable to the presently disclosed subject matter. The above may include, by way of non-limiting example, the one or more controllers 710 disclosed in the present application.

Reference is now made to FIG. 1, which illustrates a CT clamp 100, according to one or more examples of the present subject matter. CT clamp 100 may include: a core 102, a calibration board 104, a connector 106, a space 108, a housing 109, a forward handle 110A, a back handle 110B, windings 112, and actuation mechanism 113. CT clamp 100 may be or may be part of a clamp meter configured to measure one or more electrical parameters (e.g., current, voltage, etc.). Accordingly, CT clamp 100 may include and/or be configured to be connected to one or more appropriate sensor (e.g., via connector 106).

Calibration board 104 may include one include one or more circuits. The term "circuit" used herein may refer to a collection of one or more circuits. For example, calibration board 104 may include a calibration circuit that can be configured according to a certain calibration (e.g., according to a calibration code or configuration code, described in detail below). The calibration code may be configured to have any appropriate manifestation (e.g., analog, digital, physical, etc.) of a code usable to calibrate a measurement device. Calibration board 104 may be a printed circuit board (PCB) with electrical circuits including electrical elements (e.g., capacitors, resistors, fuses, switches, etc.). Various examples of calibration circuits are described in detail below with reference to FIGS. 9-22. Calibration board 104 may be configured to be removable and/or replaceable. For example, calibration board 104 may be configured to be removed from inside of the housing 109 of CT clamp 100 (e.g., to be recalibrated) and to be returned to inside the housing 109 of CT clamp 100 (e.g., after recalibration). As another example, calibration board 104 may be configured to be removed from inside of the housing 109 of CT clamp 100 (e.g., after a certain amount of time since calibration was performed, and/or based on one or more parameters indicating an issue with calibration being sensed or determined) and a different calibration board 104 may be placed instead inside the housing 109 of CT clamp 100 (e.g., after calibration of the new calibration board 104 outside of CT clamp 100, or before calibration of the new calibration board inside CT clamp 100). In some cases, a portion of the calibration board 104 may be configured to be removed and/or replaced while a remainder of the calibration board 104 remains inside of the housing 109 of the CT clamp 100.

Connector 106 may be configured to connect the CT clamp 100 to one or more other apparatus (e.g., one or more apparatus related to calibration, for example, one or more: controller, processor, display, calibration device, tester board, etc.).

Core 102 may be made from a ferromagnetic material (e.g., metal, for example, iron). CT clamp 100 may include a protective casing or a housing 109 positioned around core 102.

A portion 111 of the housing 109 has been exposed in the illustration of FIG. 1 to illustrate a portion of one or more windings 112 that are wound around core 102. Core 102 may form a space 108 configured to be positioned around an AC conductor (not shown). The AC conductor may have one or more windings (not shown), which may be configured to act as the primary windings of the CT (e.g., a current transformer may include both the one or more windings of the AC conductor and the one or more windings 112 of the CT clamp 100). The one or more windings 112 that are wound around core 102 may be configured to act as the secondary windings of the CT. The one or more windings 112 of the core 102 may be made from a conductive material (e.g., a metal such as copper). The one or more windings of the core 102 may include a relatively large number of turns (for example, hundreds of turns, or thousands of turns), some of which are illustrated as an example in the exposed portion 111 of housing 109.

Core 102 may include a slit 124 (e.g., an opening) between a first portion of the core 102 and a second portion of the core 102, also referred to as "a first core portion" and a "second core portion". Another example of a core 102 with a slit 124, first core portion 170, and second core portion 172, is illustrated, for example, in FIG. 4. CT clamp 100 may include a mechanism 140 for reversibly separating the first core portion 170 and the second core portion 172 at slit 124, which may create a gap between the first core portion 170 and the second core portion 172. This may allow the core 102 to be placed around an object (e.g., a conductor, for example, a wire or cable) without the need to disturb that object (e.g., without the need to disconnect or unplug the conductor).

Returning to FIG. 1, core 102 may be configured to be held and/or opened using one or more handles (e.g., handles 110A and/or 110B). Handle 110A and/or handle 110B may work together with and/or be part of an actuation mechanism that is configured to change the CT clamp 100 between an open configuration and a closed configuration (e.g., actuating the back handle 110B to bring it closer in distance to the forward handle 110A may cause the slit 124 in the core 102 to be opened). Actuation mechanism 113 may be or include an opening mechanism configured to help bring the CT clamp 100 into an open configuration. The actuation mechanism and/or opening mechanism may include a rotation mechanism including one or more rotation elements (e.g., a pivot, a gear, a wheel, etc.). Calibration board 104 may be located in a handle 110A or 110B of CT clamp 100 (e.g., calibration board 104 may be located in forward handle 110A).

Figure 2:
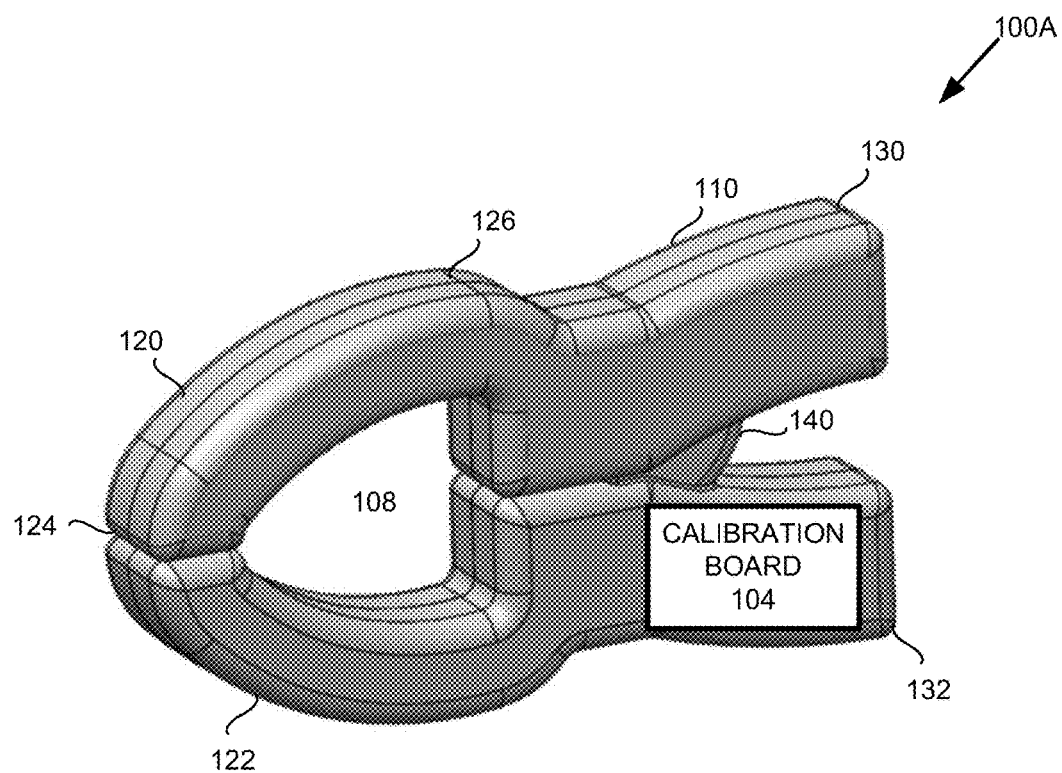
FIG. 2 illustrates an apparatus, in accordance with certain examples of the presently disclosed subject matter.

FIG. 2 illustrates a CT clamp 100A, according to one or more examples of the present subject matter. CT clamp 100A may be similar to CT clamp 100 and elements described with regards to one example may be included in the other example mutatis mutandis. FIG. 2 illustrates CT clamp 100A in a closed configuration. CT clamp 100A may include a housing 126 (e.g., similar to housing 109). Housing 126 may be a protective casing or enclosure positioned around core 102 and/or other elements of CT clamp 100. Housing 126 may be made from an insulator material (e.g., plastic). Housing may include a first forward portion 120, a second forward portion 122, a first back portion 130, and a second back portion 132. For example, one or more of the forward portions may be front portions. A first core portion may be located in the first forward portion 120, and a second core portion may be located in the second forward portion 122. An example of a first core portion 170 and a second core portion 172, are illustrated, for example, in FIG. 4. The slit 124 of CT clamp 100A may be located between the first forward portion 120 and the second forward portion 122. CT clamp 100A may include an opening mechanism (e.g., similar to actuation mechanism 113, for example, including one or more rotation element, such as a pivot). Opening mechanism 140 may be located between the first back portion 130 and the second back portion 132. The calibration board 104 of CT clamp 100A may be located in or on the second back portion 132 (e.g., in an interior section or portion of the housing 126 of CT clamp 100A).

Figure 3:
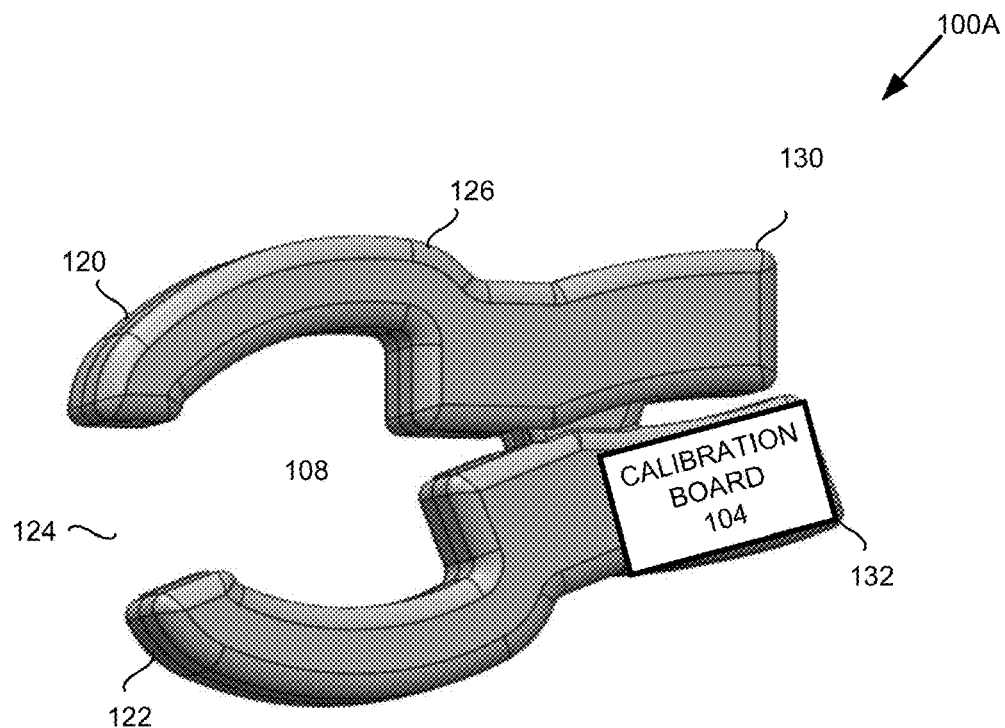
FIG. 3 illustrates an apparatus, in accordance with certain examples of the presently disclosed subject matter.

FIG. 3 illustrates CT clamp 100A in an open configuration, according to one or more examples of the present subject matter. Opening mechanism 140 may be configured so that actuating opening mechanism 140 brings first back portion 130 and second back portion 132 closer in distance to each other, and may separate first front portion 120 and second front portion 122 further apart. Separating first front portion 120 and second front portion 122 may open the space between the first core portion and the second core portion at slit 124. This may facilitate a gap 108 of CT clamp 100A around an AC conductor (e.g., an AC conductor with one or more primary windings).

Figure 4:
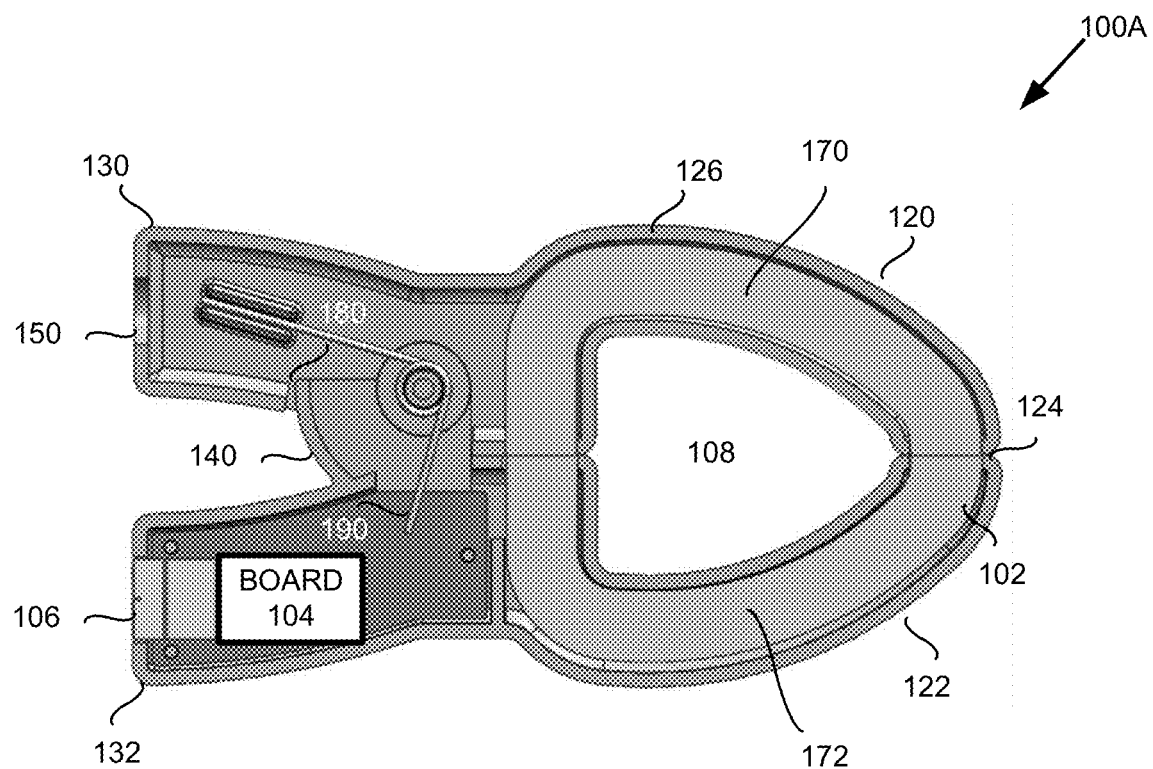
FIG. 4 illustrates an apparatus, in accordance with certain examples of the presently disclosed subject matter.
Figure 5:
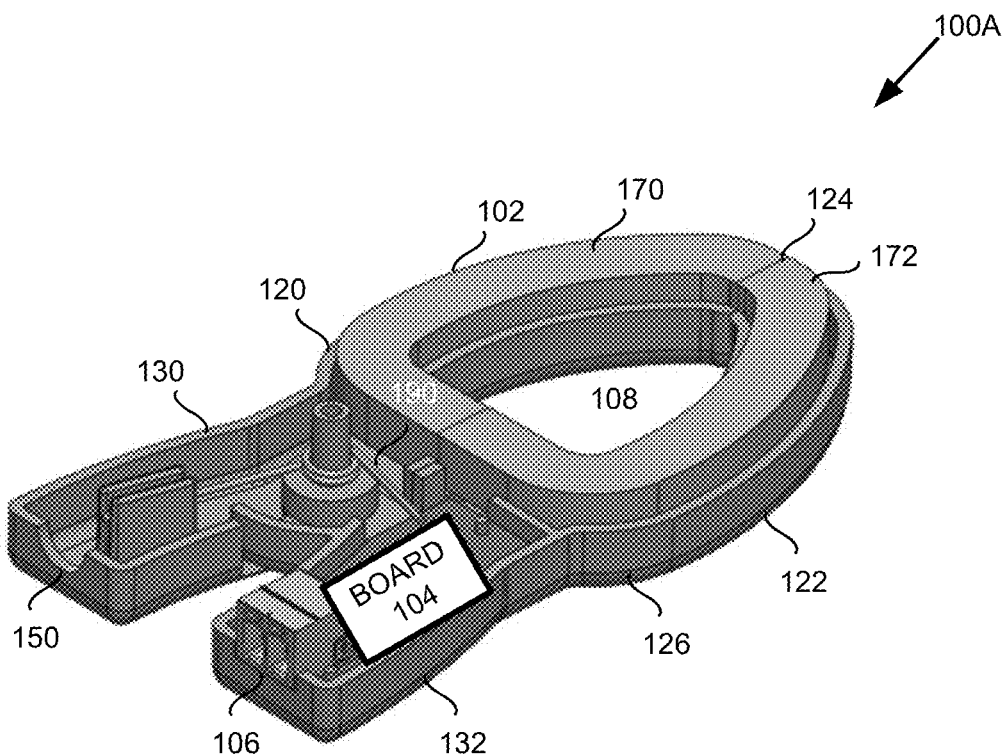
FIG. 5 illustrates an apparatus, in accordance with certain examples of the presently disclosed subject matter.

FIG. 4 and FIG. 5 illustrate CT clamp 100A in a closed configuration with part of the housing 126 removed to provide an interior view of the CT clamp 100A, according to one or more examples of the present subject matter. For the sake of simplicity the one or more windings of CT clamp 100A are not illustrated, but CT clamp 100A may include one or more windings (e.g., similar to windings 112 illustrated in FIG. 1). Core 102 may include a first core portion 170 and a second core portion 172 separated by slit 124. Slit 124 may be a space between the first core portion 170 and the second core portion 172 when CT clamp 100A is in an open configuration, and slit 124 may be a contact area between the first core portion 170 and the second core portion 172 when CT clamp 100A is in a closed configuration. CT clamp 100A may include an opening 180 in the first back portion 130 of housing 126 for inserting a portion of opening mechanism 140 into the first back portion 130. Opening 180 may be an opening into a space or void in housing 126. The space or void in housing 126 may correspond in size to some or all of the size of the portion of opening mechanism 140. Inserting the portion of opening mechanism 140 through the opening 180 and into the space of housing 126 may enable the CT clamp 100A to go into the open configuration. CT clamp 100A may also include a closing mechanism 190 (e.g., one or more springs) configured to return the CT clamp 100A to the closed configuration. CT clamp 100A may include a holding mechanism 182 configured to hold the closing mechanism 190 in place. Calibration board 104 may be connected to connector 106.

CT clamp 100A may include an additional connector 150 configured to connect the CT clamp 100A to one or more other apparatus (e.g., one or more apparatus related to taking measurements and/or adjusting or correcting measurements, such as a controller, processor, display, etc.).

Figure 6A:
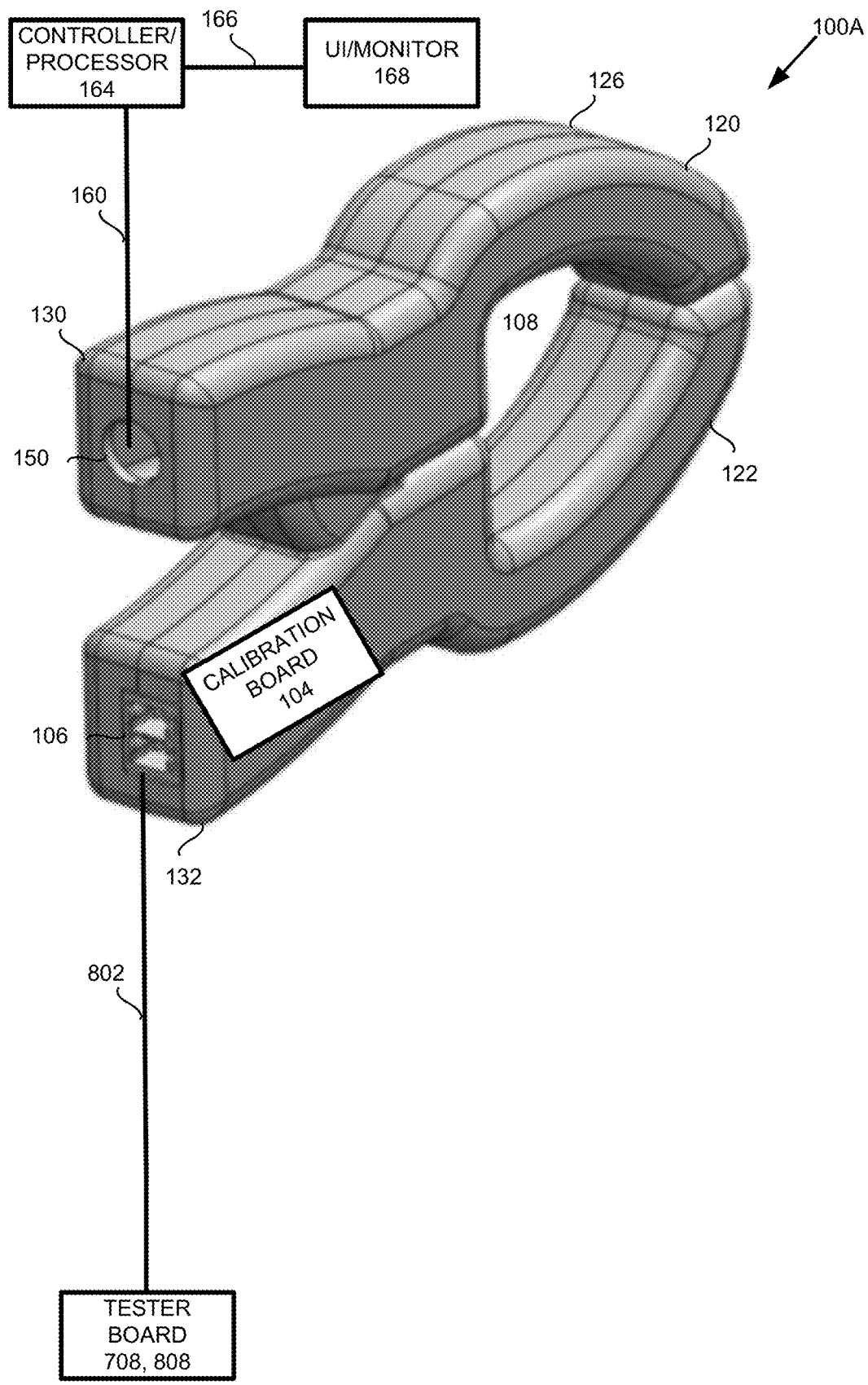
FIG. 6A illustrates an apparatus, in accordance with certain examples of the presently disclosed subject matter.

FIG. 6A illustrates a CT clamp 100A connected to a controller and/or processor 164 (which may be referred to as controller/processor 164) and a tester board 708 or 808 according to one or more examples of the present subject matter. Calibration board 104 may be connected to tester board 708 or 808 via a cable 802 such as connected to connector 106. Tester board 708 or 808 may be configured to assist calibrate CT clamp 164 so that it is configured to obtain relatively accurate measurements (e.g., increase accuracy and precision of CT clamp 100). CT clamp 100 and/or calibration board 104 may be connected to controller/processor 164 via a cable 160 that is connected to connector 150. Calibration board 104 may be electrically and/or communicatively connected to connector 150 by one or more connecting element (e.g. cable, not shown). Controller/processor 164 may be configured to provide assistance related to the measurements of the CT clamp 100. For example, controller/processor 164 may be configured to adjust the measurements of the CT clamp 100 according to certain parameters. Controller/processor 164 may be configured to help CT clamp 164 obtain and display measurements (e.g., before and/or after calibration). Controller/processor 164 may be connected to a user interface (UI) and/or monitor 168 via cable 166. UI/monitor 168 may be configured to provide a user interface and/or a monitor configured to interact with the CT clamp 100 during calibration and/or measurement. UI/monitor 168 may be configured to provide one or more indications (e.g., visual and/or audio) (e.g., one or more indications related to the calibration and/or measurement). For example, the UI may be and/or may include a graphical user interface (GUI).

In some examples tester board 708 or 808 may be directly connected to controller/processor 164 and/or graphical user interface (UI)/monitor 168.

Figure 6B:
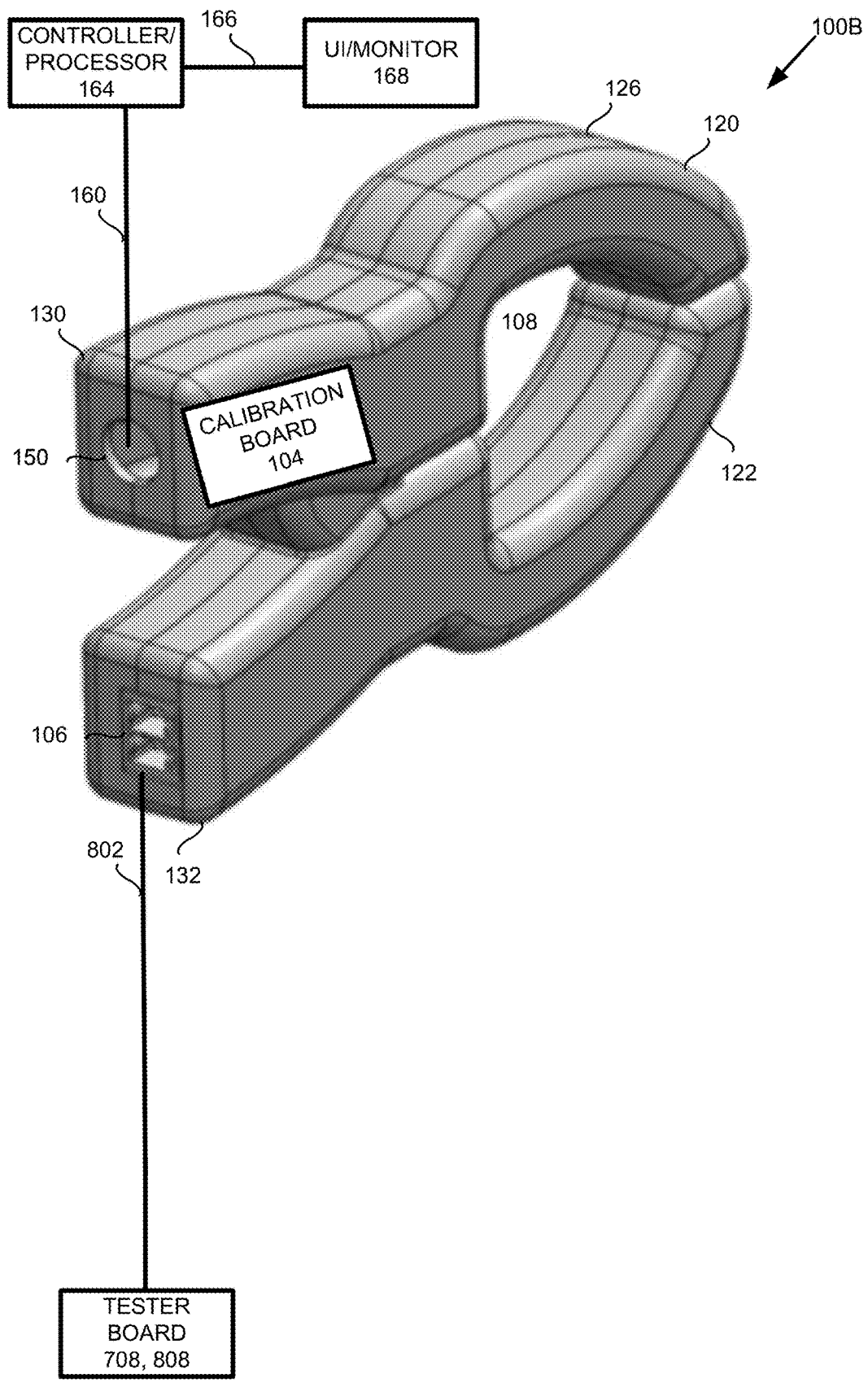
FIG. 6B illustrates an apparatus, in accordance with certain examples of the presently disclosed subject matter.

FIG. 6B illustrates a CT clamp 100B, according to one or more examples of the present subject matter. CT clamp 100B may be similar to CT clamp 100 or 100A and elements described with regards to one example may be included in the other example mutatis mutandis. The calibration board 104 of CT clamp 100B may be located in and/or on the first back portion 130 (e.g., in an interior portion of the housing 126 of CT clamp 100A). Calibration board 104 may be connected to connector 106 by one or more connecting element (e.g. cable, not shown).

Figure 6C:
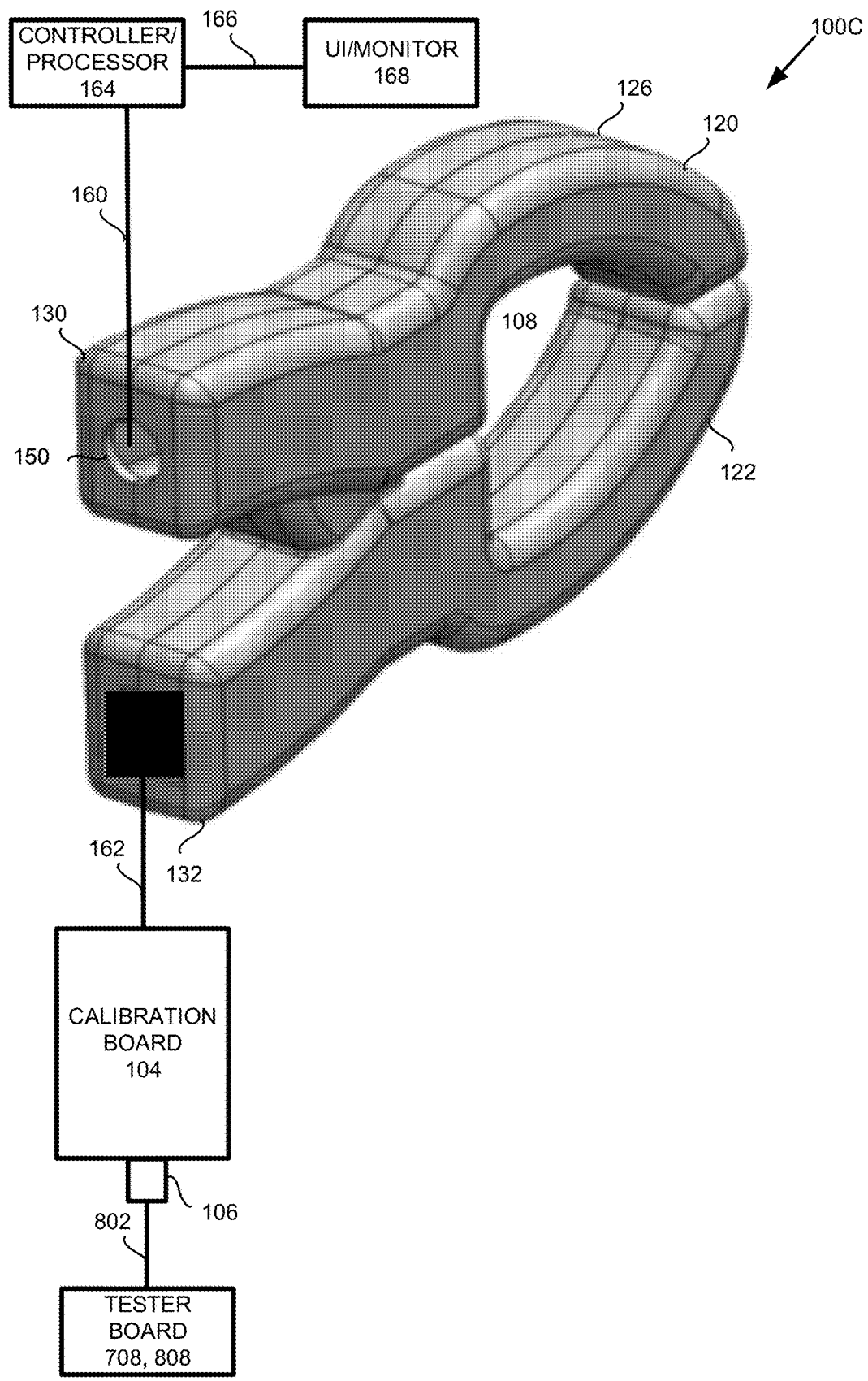
FIG. 6C illustrates an apparatus, in accordance with certain examples of the presently disclosed subject matter.

FIG. 6C illustrates a CT clamp 100C, according to one or more examples of the present subject matter. CT clamp 100C may be similar to CT clamp 100, 100A, or 100B and elements described with regards to one example may be included in the other example mutatis mutandis. The calibration board 104 of CT clamp 100C may be located external to housing 126 of CT clamp 100C. Calibration board 104 may be connected to CT clamp by one or more connecting element (e.g., cable 162). Calibration board 104 may be connected to connector 106 by one or more connecting element (not shown).

In some examples, calibration board 104 may be located on an exterior of CT clamp 100 (e.g., adjacent to one or more handles of the CT clamp).

Figure 7:
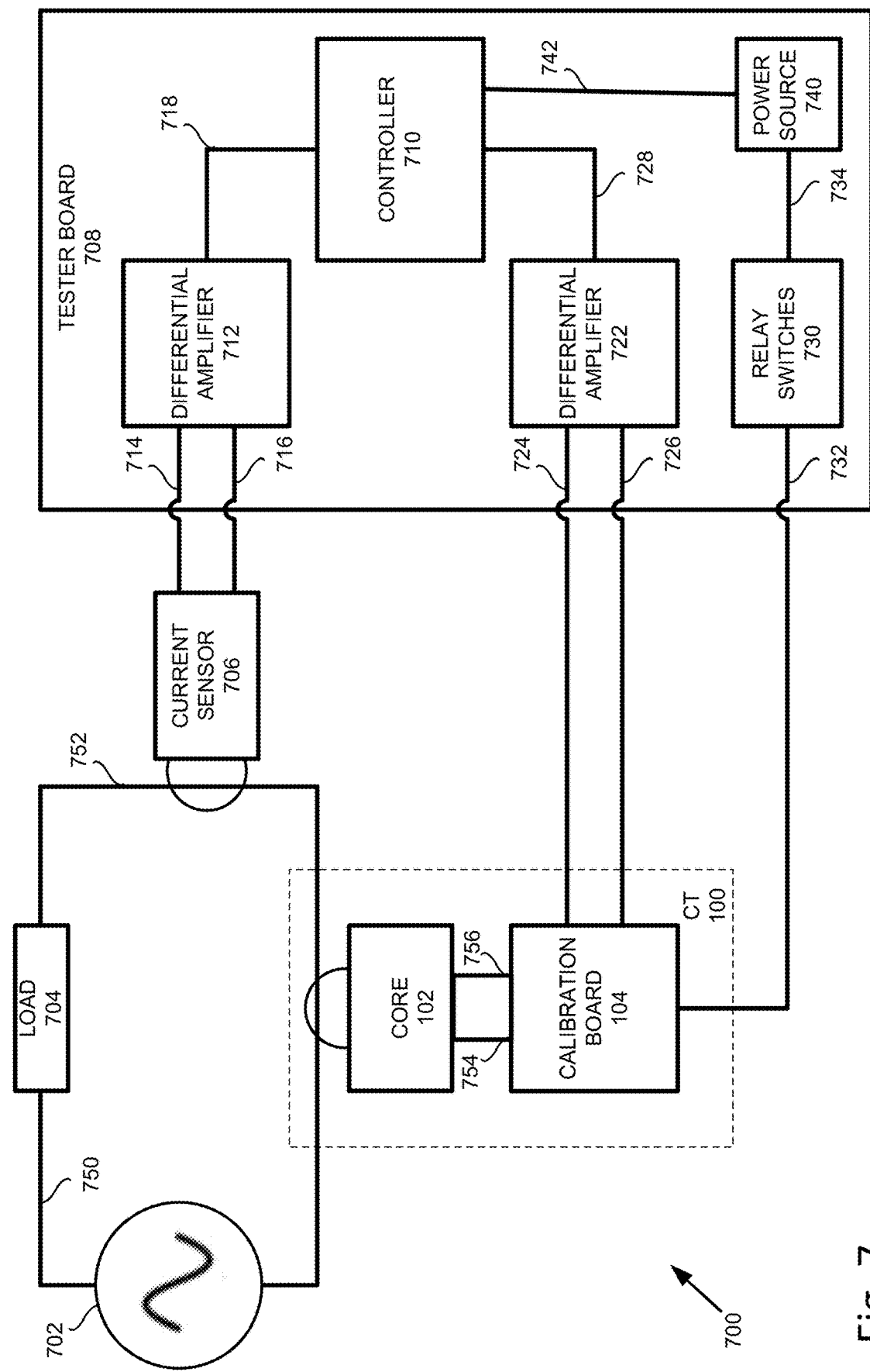
FIG. 7 illustrates a system, in accordance with certain examples of the presently disclosed subject matter.

FIG. 7 illustrates a calibration system 700, according to one or more examples of the present subject matter. Calibration system 700 may include a power source 702 (e.g., an AC power source) and one or more loads 704 (e.g., one or more: resistors, capacitors, motors, etc.). Load 704 may be electrically connected to the AC power source 702 via one or more conductors 750 and/or 752 (e.g., electrical conductors configured to conduct electrical current and/or communication signals, for example, one or more wires, cables, etc.).

Calibration system 700 may include a reference current sensor 706. Current sensor 706 may be configured to detect electric current in a conductor (e.g., a wire or a cable), and may generate a signal proportional to that current. The generated signal may be analog voltage, analog current, a digital output, etc. The generated signal may be used to display the measured current. Measured data may be stored for further analysis in a data storage system (not shown), used for the purpose of control, etc. Current sensor 706 may include, for example, one or more: shunt resistors, current transformers, Hall Effect sensors, Rogowski coils, magnetic-field based transducers, etc. It will be appreciated that a similar current sensor (e.g., of the same or different type) may also be part of or used with CT clamp 100. In some examples, current sensor 706 may be located in series with AC power source 702. In some examples, current sensor 706 may obtain a current measurement related to AC power source by using a reference current transformer clamp that is clamped around a conductor connected to AC power source 702 (as may be illustrated in FIG. 7 and FIG. 8). The reference current clamp may be configured to clamp around an electrical conductor and measure current in the conductor. It will be appreciated that other reference sensors may also be used (e.g., if calibration is done for a different measurement device). For example, a voltage sensor may be used to provide a reference voltage (e.g., if voltage is used to calibrate the CT clamp 100 and/or if voltage is used to calibrate a different measurement device, for example a voltage measurement device and/or voltage sensor). Some examples of reference sensors may be: current sensor, voltage sensor, power sensor, temperature sensor, etc. For example, the measurement device to be calibrated and the reference sensor to be used for calibration may be of the same general type (e.g., a current sensor may be used to help calibrate a current measurement device, a voltage sensor may be used to help calibrate a voltage measurement device, a temperature sensor may be used to help calibrate a temperature measurement device, etc.).

Current sensor 706 may be configured to provide relatively accurate measurements and may be used to help calibrate the CT clamp 100 (e.g., by providing relatively accurate reference measurements). For example, current sensor 706 may be configured to measure the current on conductor 752 between the load 704 and the power source 702. As another example, current sensor 706 may be configured to measure the current on conductor 750 between the power source 702 and the load 704.

Calibration system 700 may also include a device to be calibrated. For example, calibration system 700 may include a CT clamp 100 having a core 102 and a calibration board 104. Calibration board 104 may be electrically connected to the core 102 via one or more conductors 754, 756. CT clamp 100 may be configured to obtain measurements (e.g., one or more test measurements) to be compared to the one or more reference measurements obtained by the current sensor 706 (e.g., in order to calibrate the CT clamp 100). For example, CT clamp 100 may be configured to measure the same current as the current sensor 706 (e.g., the current on conductor 752 between the load 704 and the power source 702, or the current on conductor 750 between the power source 702 and the load 704).

Current sensor 706 and/or CT clamp 100 may be configured to obtain one or more of: the magnitude of an AC current, the phase of an AC current, the waveform of an AC current, a direct current (DC) related to an AC current, a voltage value, a power value, etc. Current sensor 706 and/or CT clamp 100 may be configured to obtain measurements related to relatively great currents (e.g., hundreds or thousands of amperes).

Both current sensor 706 and CT clamp 100 may be electrically connected to a tester board 708. Current sensor 706 and CT clamp 100 may be electrically connected to the tester board 708 via one or more respective conductors 714, 716, 724, and/or 726. Current sensor 706 and CT clamp 100 may provide their respective measurements (e.g., the reference measurement obtained by current sensor 706 and the test measurement obtained by CT clamp 100) to the tester board via one or more respective conductors 714, 716, 724, and/or 726 to one or more respective differential amplifiers 712 and/or 722.

Differential amplifiers 712 and 722 may be configured to amplify the difference between a plurality of respective input voltages. Differential amplifiers 712 and 722 may be analog circuits with two respective inputs and one respective output, where each output may be proportional to the difference between the two respective input voltages.

Tester board 708 may include one or more controllers 710 configured to obtain the respective amplified measurements from the one or more respective differential amplifiers 712 and 722 via one or more respective conductors 718 and/or 728. The one or more controllers 710 may be configured to compare the measurements and determine a difference between the measurements (e.g., the amplified reference measurement and the amplified test measurement). The one or more controllers 710 may also be configured to provide one or more signals to the CT clamp 100 to control one or more electrical elements (e.g., of the calibration circuit) of the CT clamp 100 (e.g., to adjust the calibration and/or change the configuration) to adjust the measurement of the CT clamp 100. For example, the measurement of the CT clamp 100 may be adjusted based on or in response to the determined differences. The measurement of the CT clamp 100 may be adjusted to bring the measurement obtained by the CT clamp 100 in greater alignment (e.g., closer in value, such as within a certain tolerance) to the reference measurement obtained by the current sensor 706 The one or more controllers 710 may be configured to determine or generate one or more calibration codes. The calibration code may correspond to one or more electrical elements (e.g., of the calibration circuit) of the CT clamp 100 or calibration board, and/or switches of the relay switches 730, which may be configured to adjust the measurement of the CT clamp when they are adjusted. As an example, the calibration circuit may be calibrated by affecting one or more electrical elements (e.g., by blowing one or more fuses). For example, each of the electrical elements may be configured to have a unique related value (e.g., based on an order of placement, physical location, and/or configuration of the electrical elements). The unique related value may correspond to a corresponding value (e.g., digital, analog, physical, etc.) of the calibration code. Examples of calibration codes are detailed in greater detail further below with reference to examples of calibration circuits.

The CT clamp 100 may also be connected to the one or more controllers 710 via one or more relays switches 730 and/or one or more power sources 740 (e.g. a DC power source). Relays switches 730 may be connected to the CT clamp 100 via one or more conductors 732 (e.g., a plurality of conductors connected to respective electrical elements or pathways of the calibration circuit), and may be connected to the one or more power sources 740 via one or more conductors 734. The one or more power sources 740 may be connected to the one or more controllers 710 via one or more conductors 742.

Relay switches 730 may be one or more electrically operated switches. Relay switches 730 may include one or more input terminals (and/or output terminals) for one or more control signals, and one or more operating contact terminals for controlling one or more switches. Relay switches 730 may be configured to be controlled by one or more signals. Relay switches 730 may be configured to perform one or more logical operations. Relay switches 730 may include one or more electromagnets configured to close or open contacts, or solid-state relays which may use semiconductor properties for control. Relay switches 730 may be configured to help control one or more electrical elements of the CT clamp 100 to adjust and/or set the measurement of the CT clamp (e.g., in order to bring the measurement obtained by the CT clamp 100 closer in value to the reference measurement obtained by the current sensor 706, or to set a calibration configuration of the CT clamp 100). Relay switches 730 may be configured to operate according to one or more signals from the one or more controllers 710 (e.g., according to a calibration code). Relay switches 730 may be configured to relay one or more burn instructions (e.g., from the one or more power sources 740 to the calibration board 104, which may help permanently open (e.g., burn) one or more electrical element and/or fuse of the calibration circuit). The one or more fuses can be any appropriate fuse or breaker that is configured to be burned or opened according to one or more certain electrical parameters (e.g., voltage and/or current above a certain threshold). The term "burn" or "blow" used herein may refer to a situation wherein the fuse may be configured to be limited or rated to one or more certain threshold electrical parameters (e.g., voltage, current, power, etc.), and if one or more electrical parameters exceeding the threshold electrical parameters are applied to the fuse, then at least a portion of the fuse may be configured to respond accordingly to open the related electrical pathway (e.g., at least a portion of the fuse may melt, disconnect, become an open circuit element, etc.). As an example, a single electrical pulse may be used to burn one or more fuses and set the calibration. For example, the calibration may be set using a single pulse of electricity that is arranged to burn a plurality of specific fuses from a larger group of fuses at the same time. As another example, a plurality of electrical pulses may be used to burn one or more fuses and set the calibration. For example, a sequence of a plurality of pulses of electricity may be used to burn a plurality of fuses from a larger group of fuses in a sequential manner to set the calibration.

The one or more power sources 740 may be any appropriate power source. For example, power source 740 may be a battery (e.g., rechargeable battery), storage device, electrical grid, generator, fuel cell, photovoltaic (PV) source, etc. The one or more power sources 740 may be configured to provide power and/or voltage to control one or more electrical elements to set the measurement of the CT clamp (e.g., according to one or more signals from the one or more controllers 710, for example, based on or in response to a difference between the obtained measurements being within a certain threshold). The one or more power sources 740 may be configured to permanently affect one or more electrical elements (e.g., of the calibration board 104), open one or more switches, and/or burn one or more fuses (e.g., to set a calibration code). Power source 740 may be configured to provide a power (voltage and current) sufficient to burn a fuse of the calibration circuit.

Figure 8:
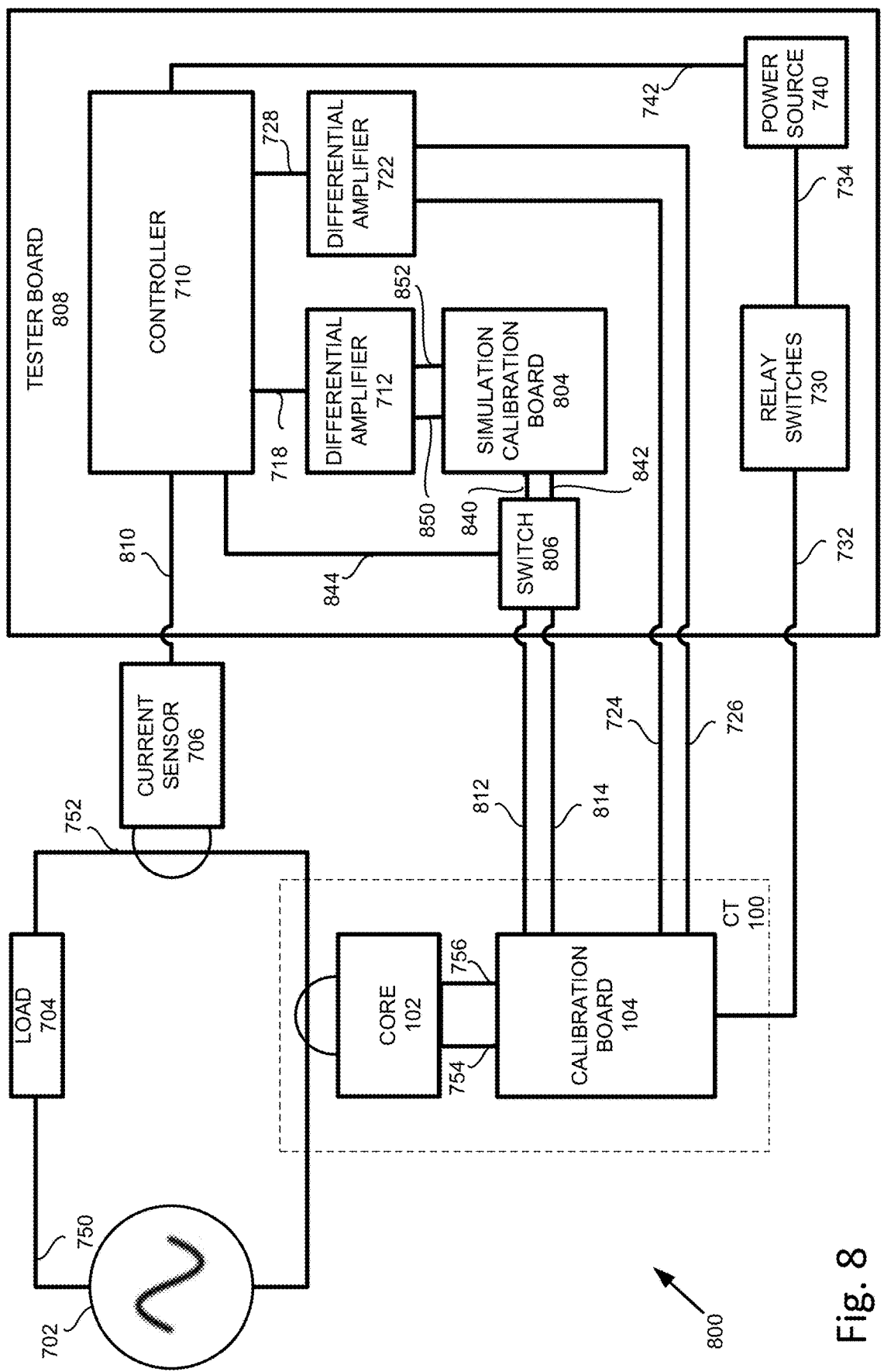
FIG. 8 illustrates a system, in accordance with certain examples of the presently disclosed subject matter.

FIG. 8 illustrates a calibration system 800 according to one or more examples of the present subject matter. Calibration system 800 may be similar to calibration system 700 and elements described with regards to one example may be included in the other example mutatis mutandis. Calibration system 800 may include a tester board 808 that may be similar to tester board 708. Tester board 808 may include simulation calibration board 804. Simulation calibration board 804 may be the same as or similar to calibration board 104. Simulation calibration board 804 may be configured to help calibrate the measurement of the CT clamp (e.g., simulation calibration may bring the measurement obtained by the CT clamp 100 closer in value to the reference measurement obtained by the current sensor 706). For example, simulation calibration board 804 may be configured to help calibrate the measurement of the CT clamp according to one or more signals from the one or more controllers 710 according to a calibration code.

The CT clamp 100 may be connected to the simulation calibration board 804 via switch 806. Switch 806 may comprise a plurality of switches. The CT clamp 100 may be connected to the switch 806 via one or more conductors 812, 814, and the switch 806 may be connected to simulation calibration board 804 via one or more conductors 840 and/or 842. The switch 806 may also be directly connected to the one or more controllers 710 via one or more conductors 844. Simulation calibration board 804 may also be connected to the one or more controllers 710 via differential amplifier 712. Differential amplifier 712 806 may comprise a plurality of differential amplifiers. The simulation calibration board 804 may be connected to the differential amplifier 712 via one or more conductors 850 and/or 852, and the differential amplifier 712 may be connected to the one or more controllers 710 via one or more conductors 718. The current sensor 706 may be connected to the one or more controllers 710 via one or more conductors 810 (e.g., using an AC connection). Tester board 808 may also include one or more Serial Peripheral Interface (SPI) (not shown), which may be configured for short-distance communication. Tester board 808 or controller 710 may also include one or more AC to DC converters, which may be configured to convert the reference measurement (e.g., an AC measurement) obtained by current sensor 706 and/or a test measurement (e.g., an AC measurement) obtained by CT clamp. The AC to DC converters may be any appropriate converters (e.g. rectifiers).

Simulation calibration board 804 may include relatively more complex, relatively larger, and/or relatively more costly circuits than calibration board 104. Simulation calibration board 804 may be used for adjusting the calibration (e.g., help determining the calibration code). Simulation calibration board 804 may be configured to perform a plurality of calibrations for a plurality of CT clamps 100. Calibration board 104 may be used for setting the calibration code (e.g., of a particular CT clamp 100). For example, simulation calibration board 804 may include switches and not fuses, while calibration board 104 may include fuses and not switches.

As an example, tester board 708 or 808 may be configured to confirm that the confirmation code has been sufficiently set in the calibration board 104 after the calibration has been set e.g., using controller 710). For example, tester board 708 or 808 may be configured to test how accurate the measurement of CT clamp 100 is after calibration has been set (e.g., using controller 710). For example, the accuracy of CT clamp 100 may be tested in comparison to current sensor 106. As an example, if the confirmation code has not been sufficiently set in the calibration board 104, tester board 708 or 808 may be configured to take one or more appropriate steps to correct the setting of the calibration (e.g., using controller 710). For example, the one or more steps may include confirming the calibration code and/or attempting to burn in the calibration code again.

Figure 9:
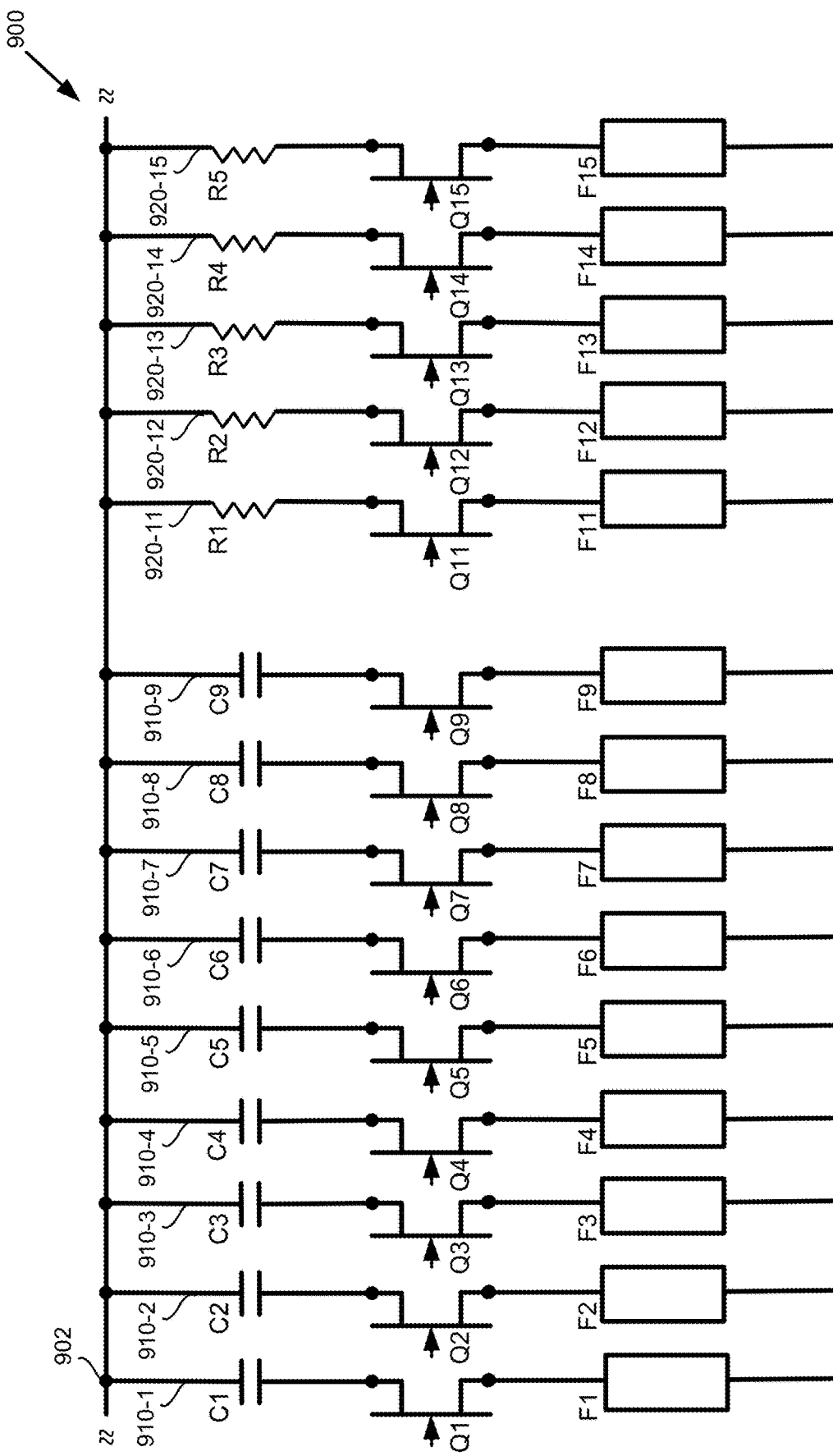
FIG. 9 illustrates electrical circuitry, in accordance with certain examples of the presently disclosed subject matter.

FIG. 9 illustrates a calibration circuit 900 according to one or more examples of the present subject matter. Calibration circuit 900 may be part of calibration board 104 and/or simulation calibration board 804. Calibration circuit 900 may include a plurality of electrical pathways 910-1-910-9 and 920-11-920-15 (referred to herein as "electrical pathways 910 and 920") connected between a first terminal 902 and a second terminal 904. Any appropriate number of pathways may be used. Each electrical pathways 910 and 920 may include one or more electrical elements (e.g., one or more: capacitors, resistors, switches, fuses, etc.) connected between the first terminal 902 and the second terminal 904 (e.g., such that a plurality of electrical elements are connected between the first terminal 902 and the second terminal 904). The plurality of electrical elements may include a plurality of capacitors C1-C9 connected in parallel and/or a plurality of resistors R1-R5 connected in parallel (which may be in separate circuits and/or separate boards). Each capacitor of the plurality of capacitors C1-C9 may be connected to a respective switch of a plurality of switches Q1-Q9 and a respective fuse of a plurality of fuses F1-F9. Each capacitor of the plurality of capacitors C1-C9 may be connected to the respective fuse of the plurality of fuses F1-F9 via the respective switch of the plurality of switches Q1-Q9. Each respective capacitor of the plurality of capacitors C1-C9 may be connected to the first terminal 902, and each respective fuse of the plurality of fuses F1-F9 may be connected to the second terminal 904. Each resistor of the plurality of resistors R1-R5 may be connected to a respective switch of a plurality of switches Q11-Q15 and a respective fuse of a plurality of fuses F11-F15. Each resistor of the plurality of resistors R1-R5 may be connected to the respective fuse of the plurality of fuses F11-F15 via the respective switch of the plurality of switches Q11-Q15. Each respective resistor of the plurality of resistors R1-R5 may be connected to the first terminal 902, and each respective fuse of the plurality of fuses F10-F14 may be connected to the second terminal 904. The plurality of electrical pathways may include different types of electrical pathways. For example, each respective electrical pathway 910 may include a capacitor C, a switch Q, and a fuse F. As an example, the respective electrical pathway 910 may include a capacitor C with a terminal connected to terminal 902 and another terminal connected to a terminal of switch Q, another terminal of switch Q may be connected to a terminal of fuse F, and another terminal of fuse F may be connected to terminal 904. For example, each respective electrical pathway 920 may include a resistor R, a switch Q, and a fuse F. As an example, the respective electrical pathway 920 may include a resistor R with a terminal connected to terminal 902 and another terminal connected to a terminal of switch Q, another terminal of switch Q may be connected to a terminal of fuse F, and another terminal of fuse F may be connected to terminal 904. As an example, one or more electrical pathways of one or more types may be located in a first housing and/or apparatus (e.g., related to a first set of windings of the current transformer), and one or more other electrical pathways of one or more types may be located in another housing and/or apparatus (e.g., related to the first set of windings of the current transformer, or a different set of windings of the current transformer). For example, a first set of windings of the current transformer may be used for calibration, and a different set of windings of the current transformer may be used for measurement. A first winding connected to a fusing circuit configured for adjusting a measurement through the first and second windings. Where the first winding is adjustable by burning fuses to achieve an accuracy of 1 milliamp relative to a reference current value.

The electrical pathways 910 or 920 (which may be referred to as pathways "910, 920") may be configured to adjust and/or set the measurement of the calibration circuit 900. For example, electrical pathways 910 with capacitors C1-C9 may be configured to adjust the measurement of the phase of the current (e.g., controlling which electrical pathways 910 with capacitors are operational or not operational may adjust the measured phase of the current). For example, closing or opening one or more of the electrical pathways 910 with capacitors C1-C9 may bring the phase of the test current closer in value to or farther in value away from the phase reference current, causing there to be a lesser or greater phase difference between the measured currents. As another example, the electrical pathways 920 with resistors R1-R5 may be configured to adjust the measurement of the amplitude or gain of the current (e.g., controlling which electrical pathway 920 with resistors are operational or not operational may adjust the measured amplitude or gain of the current). For example, closing or opening one or more of the electrical pathways 920 with resistors R1-R5 may bring the amplitude of the test current closer in value to or farther in value away from the reference current, causing there to be a lesser or greater amplitude or gain difference between the measured currents. The electrical pathways 910, 920 may be configured to be opened or closed (e.g., operational or not operational) by controlling and affecting one or more electrical elements of the respective electrical pathways 910, 920. For example, the respective electrical pathway 910, 920 may be configured to be opened or closed by actuating the respective switch Q of that pathway (e.g., either permanently or non-permanently affecting that electrical element, such as by permanently or non-permanently opening or closing that respective electrical pathways 910, 920). The respective electrical pathway 910, 920 may be configured to be opened or closed by burning or not burning the respective fuse F of that pathway (e.g., by permanently affecting that electrical element, such as by permanently opening/closing that respective electrical pathways 910, 920).

In some examples, the electrical pathways 910, 920 may be configured to be non-permanently affected (e.g., opened or closed, such as by using one or more switches Q) during calibration to adjust the measurement of the calibration circuit 900 (e.g., according to one or more control signals or a calibration code from one or more controller 710, which may be based on or in response to the measured currents or one or more determined differences between the measured currents). For example, the switches Q, such as switches Q1-Q15 shown in FIG. 9, may be transistors that are arranged to be normally switched ON, and during calibration (before burning the fuses F and setting the calibration configuration) one or more of the switches Q may be controlled to be switched OFF in order to adjust the measurement and determine the calibration to be set (e.g., a final calibration code to set the calibration configuration). As an example, first measurements may be taken with switches Q1-Q15 turned ON, then second measurements may be taken with switch Q1 turned OFF and switches Q2-Q15 turned ON, then third measurements may be taken with switch Q1 and Q2 turned OFF and switches Q3-Q15 turned ON, etc. until a final calibration code is determined. As an example, one or more switches Q may be controlled to adjust one aspect of measurement and one or more other switches Q may be controlled to adjust another aspect of measurement. For example, switches Q1-Q9 may be controlled to adjust the measurement of the phase of the measured current and switches Q11-Q15 may be controlled to adjust the measurement of the amplitude or gain of the measured current.

In some examples, the electrical pathways 910, 920 may be configured to be permanently affected (e.g., opened or closed, for example, using one or more fuses F) to set the calibration (e.g. set a configuration) of the calibration circuit 900 (e.g., according to one or more control signals or a calibration code from one or more controller 710, which may be based on or in response to the measured currents or one or more determined differences between the measured currents, such as if one or more conditions has been met).

In some examples, the electrical pathways 910, 920 may be configured to be non-permanently affected (e.g., opened or closed, such as by using one or more switches Q) to set the calibration (e.g. set a configuration) of the calibration circuit 900 (e.g., according to one or more control signals or a calibration code from one or more controllers 710, which may be based on or in response to the measured currents or one or more determined differences between the measured currents, such as if one or more conditions has been met).

Switches Q may be any appropriate switches. For example, switches Q may be one or more: field effect transistor (FET), junction gate field-effect transistor (JFET), metal-oxide-semiconductor field-effect transistor (MOSFET), bipolar junction transistor (BJT), insulated-gate bipolar transistor (IGBT), Silicon Carbide (SiC) switch, Gallium Nitride (GaN), solenoid switch(es), relay switch(es), contactor switch(es), etc.

An electrical pathway may be configured to provide an electrical connection between the two terminals when the electrical pathway is in a closed circuit configuration (e.g. the respective switch is closed and/or the respective fuse is not burned). The electrical pathways 910 and 920 in FIG. 9 are illustrated in the closed circuit configuration. The electrical pathway may be configured to create an open circuit when the electrical pathway is in an open circuit configuration (e.g. the respective switch is open and/or the respective fuse is burned). Some examples of electrical pathways in the open circuit configuration are illustrated in FIG. 10.

Figure 10:
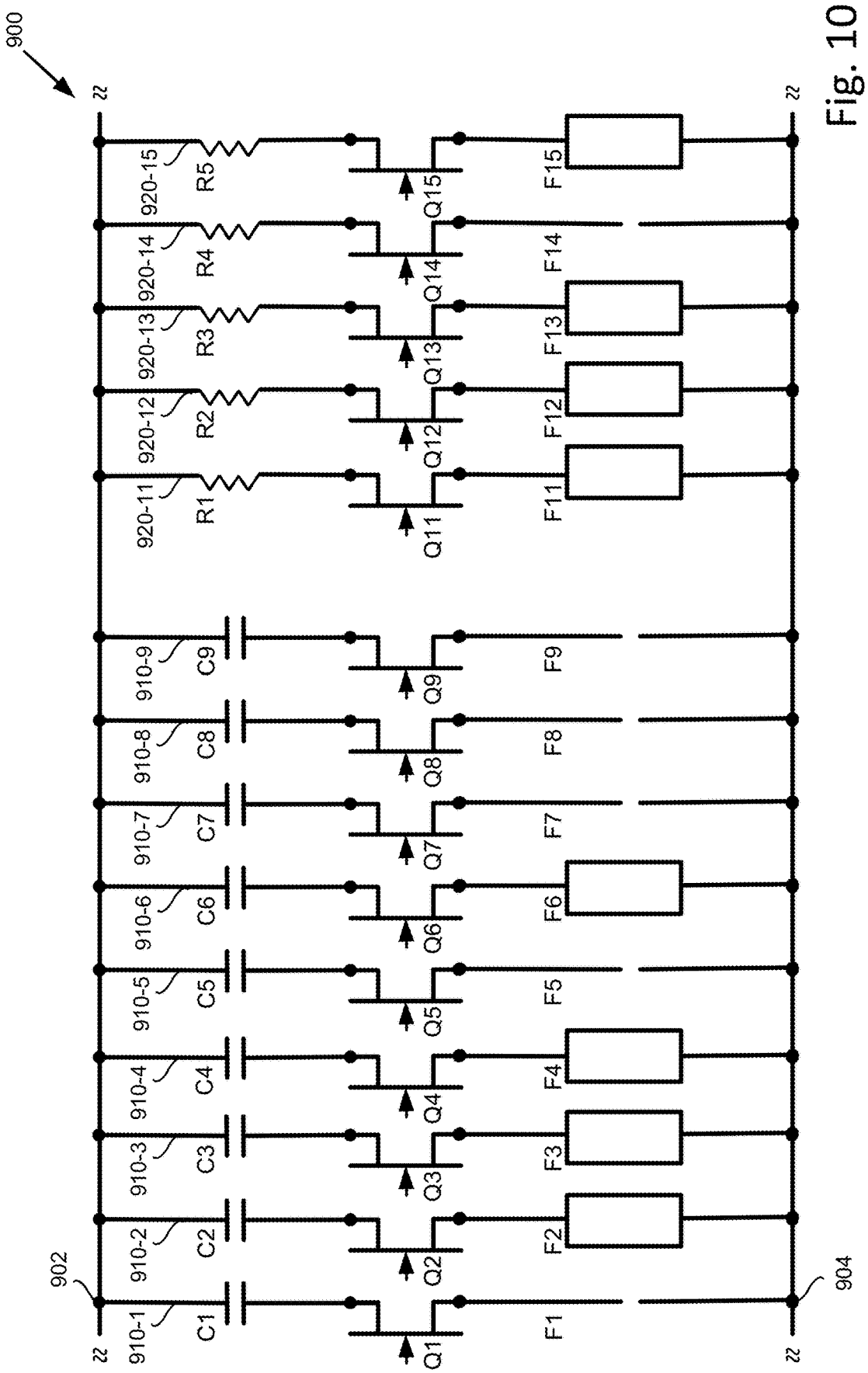
FIG. 10 illustrates electrical circuitry, in accordance with certain examples of the presently disclosed subject matter.

FIG. 10 illustrates circuit 900 with a set calibration, according to one or more examples of the present subject matter. For example, the calibration may be set by affecting one or more electrical pathways 910 and 920 (e.g., by affecting one or more electrical elements in the one or more electrical pathways) of calibration circuit 900 (e.g., on a calibration board 104 of CT clamp 100, or on a simulation calibration board 804 of tester board 808). As an example, calibration may be set by burning one or more electrical elements (e.g., one or more fuses of fuses F1-F9 and F11-F15). The calibration of circuit 900 may be done according to a calibration code. The calibration code may be determined by comparing a reference current to a test current and adjusting the measurement of the calibration circuit (e.g., by affecting one or more electrical elements of the circuit 900, such as by closing or opening one or more switches Q of a respective electrical pathway 910, 920). The measurement of the calibration circuit 900 may be adjusted by iteration (e.g., for each iteration the measurement may be adjusted, and the adjustment may be for the same amount or a different amount each time). One or more elements (e.g., numbers or symbols) of the calibration code may correspond to one or more electrical elements of circuit 900. For example, one or more elements of the calibration code may indicate whether one or more elements of the circuit 900 should be turned off (e.g., burned) or turned on (e.g., not burned), thereby setting the calibration code in the circuit 900. For example, a "0" in the calibration code may indicate that the electrical element should be turned off (e.g., burned), which may open the respective electrical pathway 910, 920 (e.g. creating an open circuit in the respective electrical pathway 910, 920). The term "turned off" may refer to any appropriate way of disconnecting the electrical element from the electrical pathway (e.g., de-activation, de-energization, destruction, etc.). As another example, a "1" in the calibration code may indicate that the electrical element should be turned on (e.g., not burned), which may facilitate operation of the respective electrical pathway 910, 920 (e.g. facilitating the flow of current through the respective electrical pathway 910). The term "turned on" may refer to any appropriate way of connecting the electrical element to the electrical pathway (e.g., activation, energization, not destroying, etc.). For example, a "0" in the calibration code may indicate that the fuse F1 of electrical pathway 910-1 should be burned and/or switch Q1 should be turned off. As another example, a "1" in the calibration code may indicate that the fuse F11 of electrical pathway 920-11 should be "not burned" and/or switch Q10 should be turned on. For example, the calibration code set in FIG. 10 may be "011101000 11101" which may correspond to pathways 910-1, 910-5, 910-7, 910-8, 910-9, 920-14 being open or otherwise non-operational (e.g., fuses F1, F5, F7, F8, F9, and F14 being burned) and pathways 910-2, 910-3, 910-4, 910-6, 920-11, 920-12, 920-13, 920-15 being closed or otherwise operational (e.g., fuses F2, F3, F4, F6, F11, F12, F13, and F15 not being burned). As an example, where fuses F1, F5, F7, F8, F9, and F14 are burned, a single electrical pulse may be used to burn all of the fuses F1, F5, F7, F8, F9, and F14 at about the same time and set the calibration. As another example, a plurality of electrical pulses may be used in sequence to burn the fuses F1, F5, F7, F8, F9, and F14 and set the calibration. For example, a first pulse of electricity may be used to burn fuse F1, a second subsequent pulse of electricity may be used to burn fuse F5, a third subsequent pulse of electricity may be used to burn fuse F7, a fourth subsequent pulse of electricity may be used to burn fuse F8, a fifth subsequent pulse of electricity may be used to burn fuse F9, and a sixth subsequent pulse of electricity may be used to burn fuse F14, in order to set the calibration.

Figure 11:
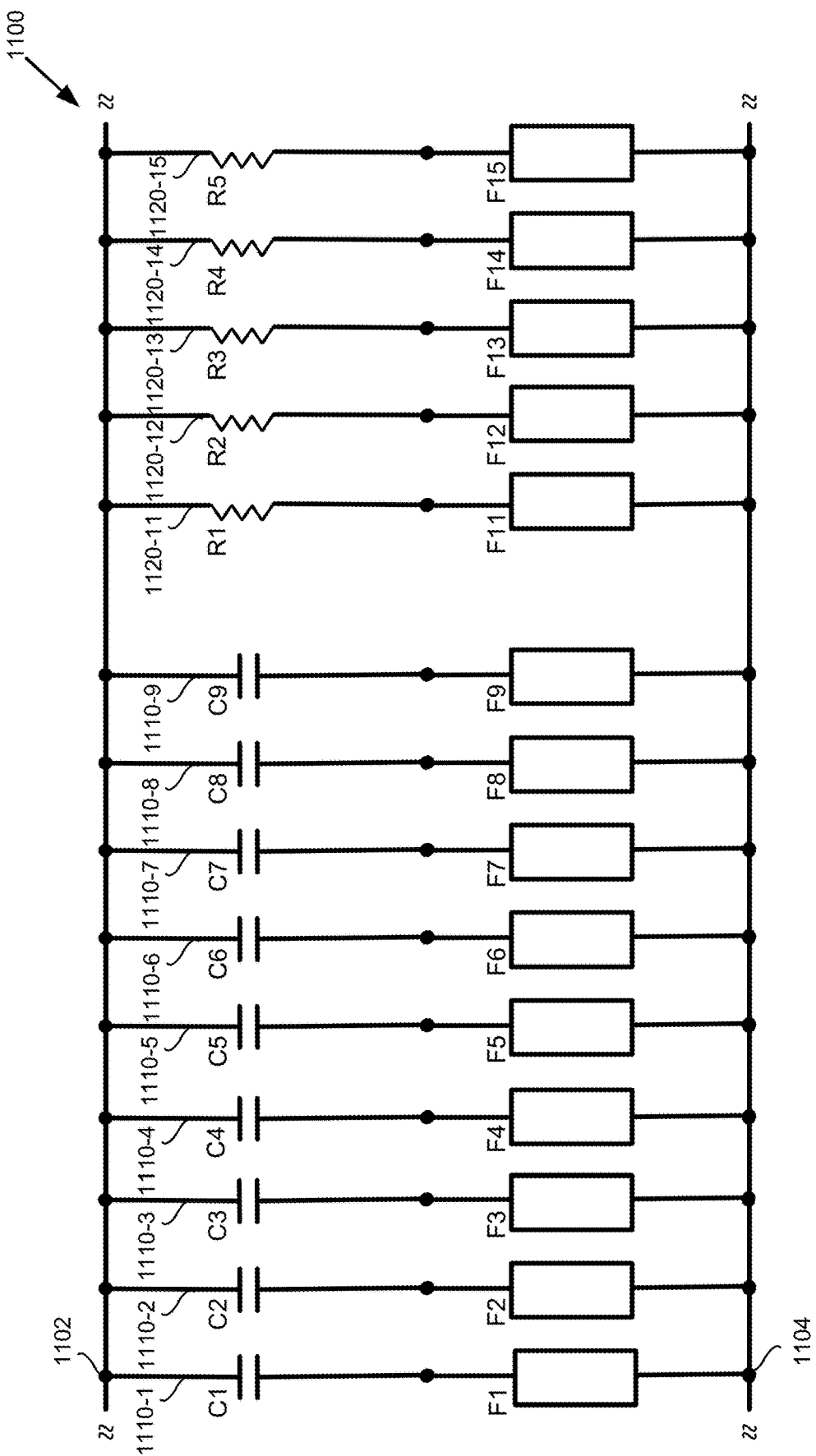
FIG. 11 illustrates electrical circuitry, in accordance with certain examples of the presently disclosed subject matter.

FIG. 11 illustrates a calibration circuit 1100 according to one or more examples of the present subject matter. Calibration circuit 1100 may be similar to calibration circuit 900 and elements described with regards to one example may be included in the other example mutatis mutandis. Calibration circuit 1100 may include a plurality of electrical pathways 1110-1-1110-9 and 1120-11-1120-15 (referred to herein as "electrical pathways 1110 and 1120") connected between a first terminal 1102 and a second terminal 1104. The plurality of electrical pathways 1110, 1120 may include different types of electrical pathways. For example, each respective electrical pathway 1110 may include a capacitor C and a fuse F. As an example, the respective electrical pathway 1110 may include a capacitor C with a terminal connected to terminal 1102 and another terminal connected to a terminal of fuse F, and another terminal of fuse F may be connected to terminal 1104. For example, each respective electrical pathway 1120 may include a resistor R and a fuse F. As an example, the respective electrical pathway 1120 may include a resistor R with a terminal connected to terminal 1102 and another terminal connected to a terminal of fuse F, and another terminal of fuse F may be connected to terminal 1104. As mentioned above, one or more electrical pathways of one or more types may be located in a first housing, and one or more other electrical pathways of one or more types may be located in another housing.

Calibration circuit 1100 may include fewer electrical elements than calibration circuit 900. For example, calibration circuit 1100 may not include switches Q (or may include fewer switches Q). Calibration circuit 1100 may be relatively smaller and relatively less costly than calibration circuit 900.

As an example, calibration circuit 1100 may be configured as circuitry on calibration board 104 and calibration circuit 900 may be configured as circuitry on simulation calibration board 804. For example, calibration may be adjusted using one or more switches Q on simulation calibration board 804 of the tester board 808 and the calibration may be set using one or more fuses F on calibration board 104 of the CT clamp 100. In some examples the calibration circuit 900 on the simulation calibration board 804 may not include fuses F (e.g., the electrical pathways 910, 920 of calibration circuit 900 may include switches Q and not fuses F). This may allow the calibration circuit 900 on the tester board 808 to be reusable, since it might not be permanently set for each calibration. This may also allow the calibration circuit 1100 on the calibration board 104 of the CT clamp 100 to be relatively less restrictive, since it might not require as many electrical elements.

Figure 12:
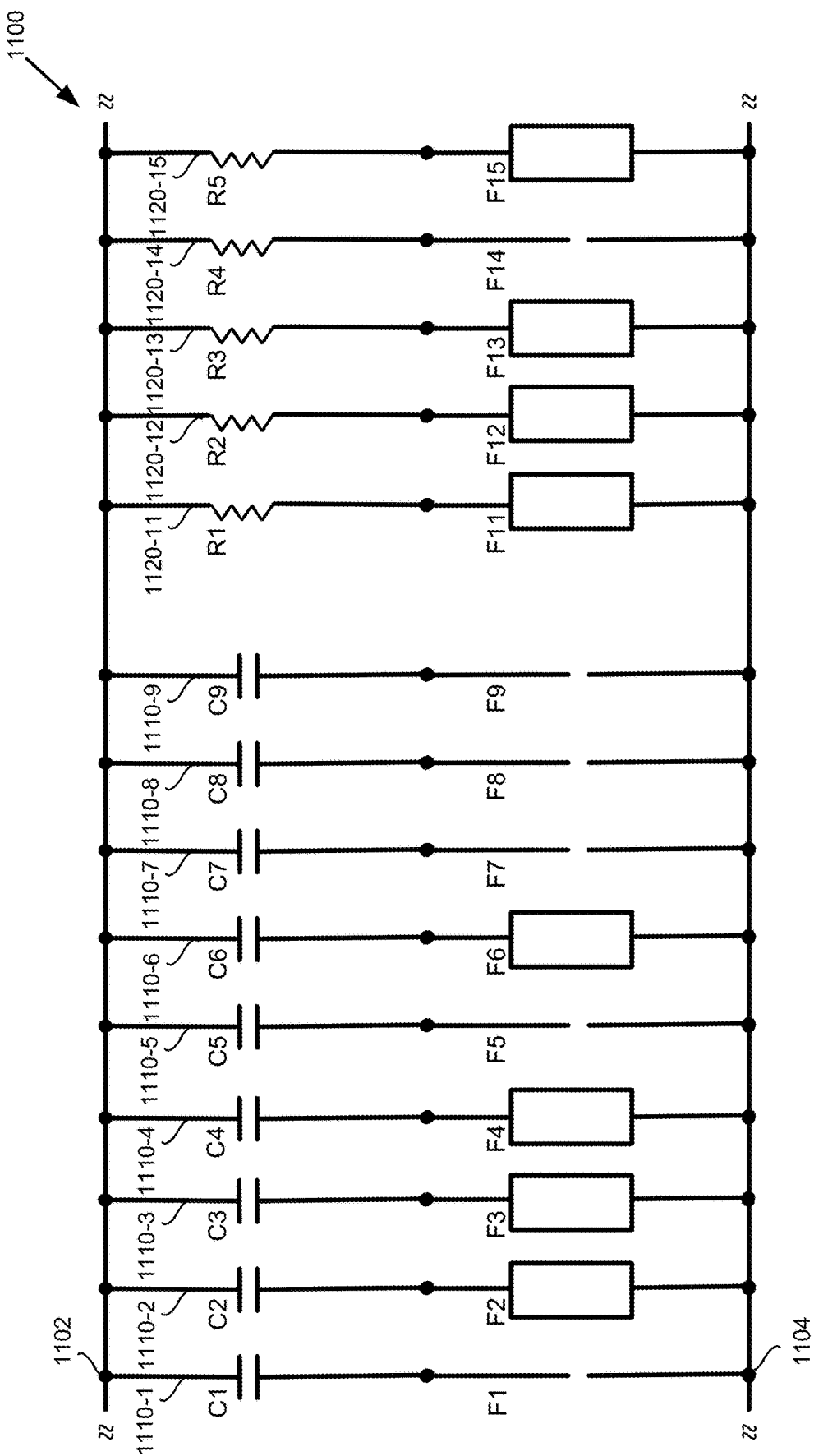
FIG. 12 illustrates electrical circuitry, in accordance with certain examples of the presently disclosed subject matter.

FIG. 12 illustrates circuit 1100 with a set calibration, according to one or more examples of the present subject matter. For example, the calibration may be set on calibration circuit 1100 (e.g., on calibration board 104 of CT clamp 100) based on a calibration code that was determined using calibration circuit 900 (e.g., on simulation calibration board 804 of tester board 808). For example, the calibration code set in FIG. 12 may be "011101000 11101" (e.g., the same as in FIG. 10) which may correspond to pathways 1110-1, 1110-5, 1110-7, 1110-8, 1110-9, 1120-14 being open or non-operational (e.g., fuses F1, F5, F7, F8, F9, and F14 being burned) and pathways 1110-2, 1110-3, 1110-4, 1110-6, 1120-11, 1120-12, 1120-13, 1120-15 being closed or operational (e.g., fuses F2, F3, F4, F6, F11, F12, F13, and F15 not being burned).

Figure 13:
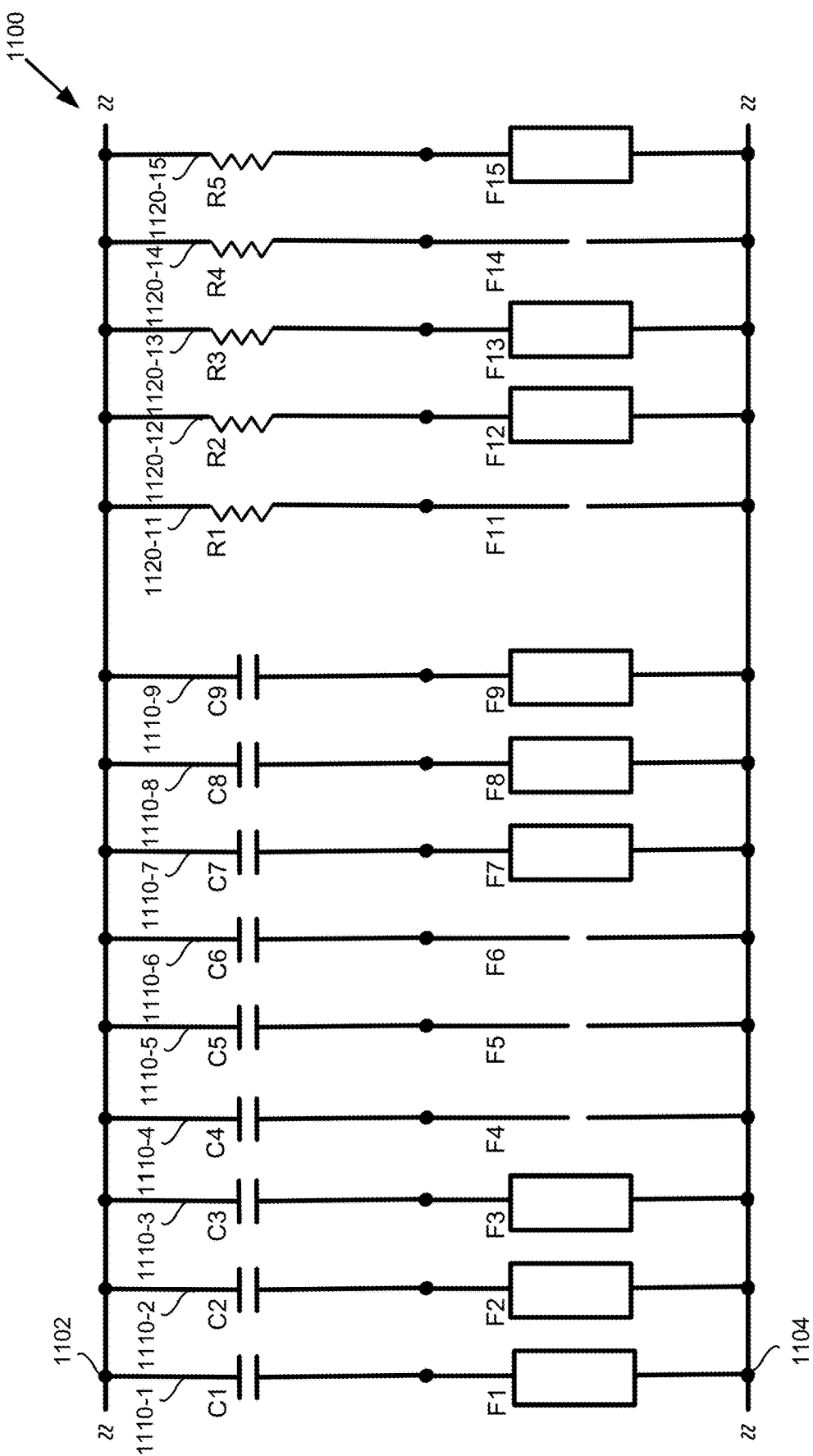
FIG. 13 illustrates electrical circuitry, in accordance with certain examples of the presently disclosed subject matter.

FIG. 13 illustrates circuit 1100 with a different set calibration, according to one or more examples of the present subject matter. For example, the calibration code set in FIG. 13 may be "111000111 01101" which may correspond to pathways 1110-4, 1110-5, 1110-6, 1120-11, 1120-14 being open or non-operational (e.g., fuses F4, F5, F6, F1l, and F14 being burned) and pathways 1110-1, 1110-2, 1110-3, 1110-7, 1110-8, 1110-9, 1120-12, 1120-13, 1120-15 being closed or operational (e.g., fuses F1, F2, F3, F7, F8, F9, F12, F13, and F15 not being burned).

In some examples, calibration may be adjusted and set on a calibration board having calibration circuits in the CT clamp (e.g., a calibration board having one or more switches and fuses, and without using a simulation calibration board).

In some examples, calibration may be adjusted on a simulation calibration board having calibration circuits, and calibration may be set on a calibration board having calibration circuits. For example, calibration may be adjusted on a simulation calibration board having one or more switches but not fuses. The simulation calibration board may be external to the CT clamp, such as a simulation calibration board on a tester board. The calibration may be set on a calibration board having one or more fuses but not switches). The calibration board may be internal to the CT clamp, such as by having the calibration board inside a housing of the CT clamp. Calibration may be set on the calibration board of the CT clamp after a calibration code has been determined using the simulation calibration board.

In some examples, calibration may be determined without a calibration board having calibration circuits (e.g., without a physical calibration board with switches and/or fuses, which may calculate the calibration theoretically, such as by using a virtual calibration board without a tester board) and calibration may be set on a calibration board having calibration circuits in the CT clamp (e.g., a calibration board having one or more fuses but not switches, calibration being set on the calibration board of the CT clamp after a calibration code has been determined using the theoretical calculations and/or virtual calibration board).

In some examples, calibration may be done for different power factors. Power factor(s) may be measured using any appropriate method (e.g., the wattmeter-ammeter-voltmeter method, wherein the power in watts may be divided by the product of measured voltage and current). As another example, a power factor meter with a moving coil meter may be used.

Figure 14:
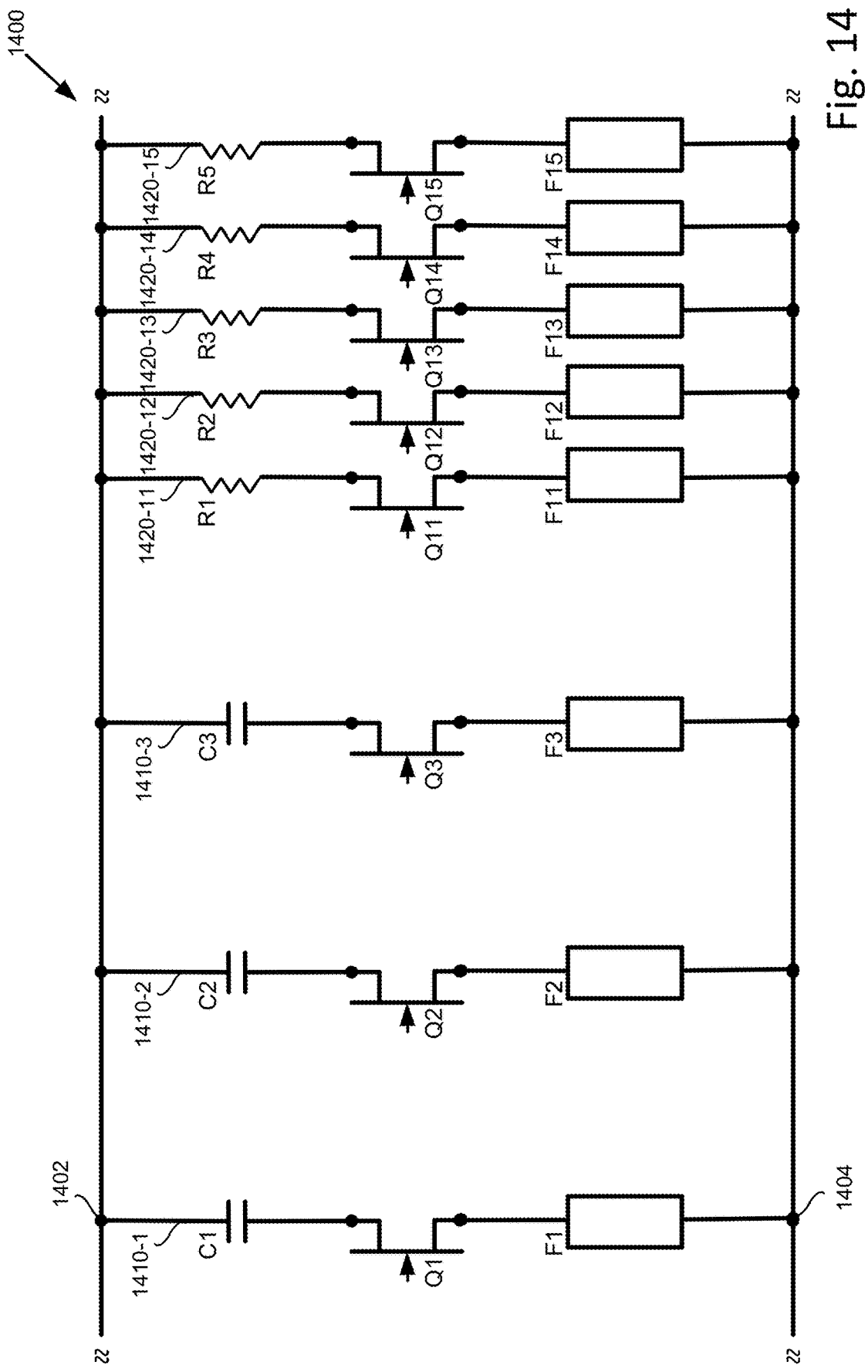
FIG. 14 illustrates electrical circuitry, in accordance with certain examples of the presently disclosed subject matter.

FIG. 14 illustrates a calibration circuit 1400 according to examples of the present subject matter. Calibration circuit 1400 may be similar to calibration circuit 900 or 1400 and elements described with regards to one example may be included in the other example mutatis mutandis. Calibration circuit 1400 may include a plurality of electrical pathways 1410-1-1410-3 and 1420-11-1420-15 (referred to herein as "electrical pathways 1410 and 1420") connected between a first terminal 1402 and a second terminal 1404. The plurality of electrical pathways 1410, 1420 may include different types of electrical pathways. For example, each respective electrical pathway 1410 may include a capacitor C, a switch Q, and a fuse F, and each respective electrical pathway 1420 may include a resistor R, a switch Q, and a fuse F.

Calibration circuit 1400 may include fewer electrical pathways 1410, 1420 than calibration circuit 900 or 1100. For example, calibration circuit 1400 may include fewer electrical pathways 1410 with capacitors C than electrical pathways 910 or 1110 with capacitors C. Calibration circuit 1400 may be relatively smaller and relatively less costly than calibration circuit 900 and/or calibration circuit 1100.

Calibration circuit 1400 may be relatively less accurate than calibration circuit 900 or calibration circuit 1100, but may be configured to be used with one or more additional elements that increase the accuracy of the measurement of CT clamp 100. For example, one or more controllers and/or processors (e.g., controller/processor 164) may be configured to adjust the measurement of the CT clamp based on the measurement obtained with the help of calibration circuit 1400. For example, the accuracy may be increased based on additional statistical data, a known needed correction based on the level of calibration set in the calibration circuit, and/or a look up table. For example, the one or more additional elements (e.g., controller and/or processor) may be configured to adjust an initial measurement to increase the accuracy of the measurement and obtain a more accurate adjusted measurement.

The calibration process of calibration circuit 1400 may require relatively less time than the calibration process for calibration circuit 900 or 1100. The additional elements that increase the accuracy of the measurement may help enable the CT clamp to achieve comparably accurate results (e.g., within a certain tolerance). In some examples, once the calibration process has reached a certain level of accuracy for calibration circuit 1400 the remainder of the calibration process may be performed using calibration data (e.g., obtained statistical data). This level of calibration which is sufficient for calibration circuit 1400 might not be sufficient for calibration circuit 900 or 1100.

In some examples, the CT clamp and calibration circuit may be configured with a known amount of deviation of measurement. CT clamp and/or additional elements (e.g., one or more controllers or processors connected to CT clamp 100) may be configured to correct the known deviation and fix the measurement in order to provide a relatively accurate measurement.

Figure 15:
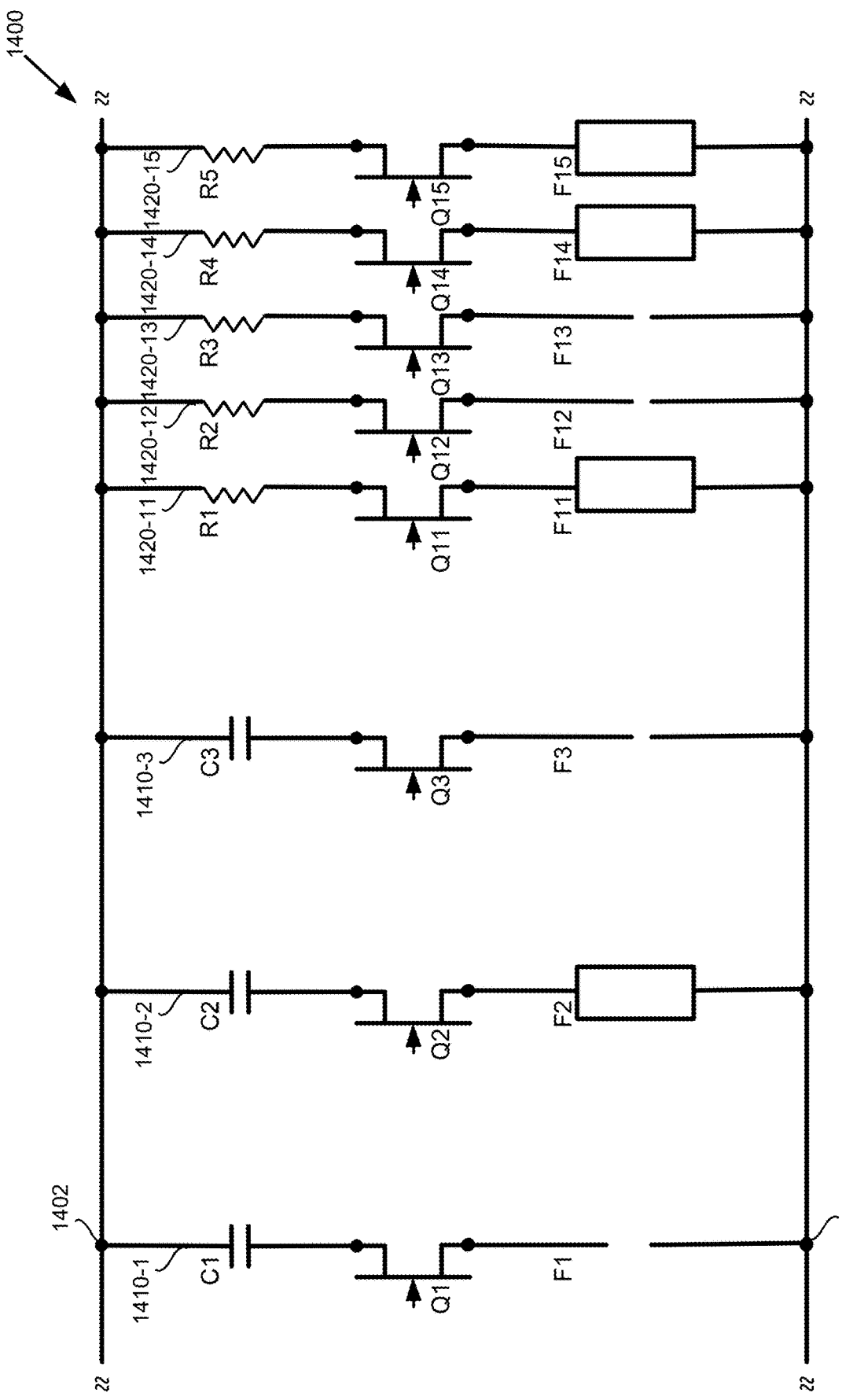
FIG. 15 illustrates electrical circuitry, in accordance with certain examples of the presently disclosed subject matter.

FIG. 15 illustrates circuit 1500 with a set calibration, according to one or more examples of the present subject matter. For example, the calibration may be set on calibration circuit 1400 (e.g., on calibration board 104 of CT clamp 100, or on simulation calibration board 804 of tester board 808) based on a calibration code. For example, the calibration code set in FIG. 15 may be "010 10011" which may correspond to pathways 1410-1, 1410-3, 1420-12, 1420-13 being open or non-operational (e.g., fuses F1, F3, F12, and F13 being burned) and pathways 1410-2, 1420-11, 1420-14, 1420-15 being closed or operational (e.g., fuses F2, F11, F14, and F15 not being burned).

Figure 16:
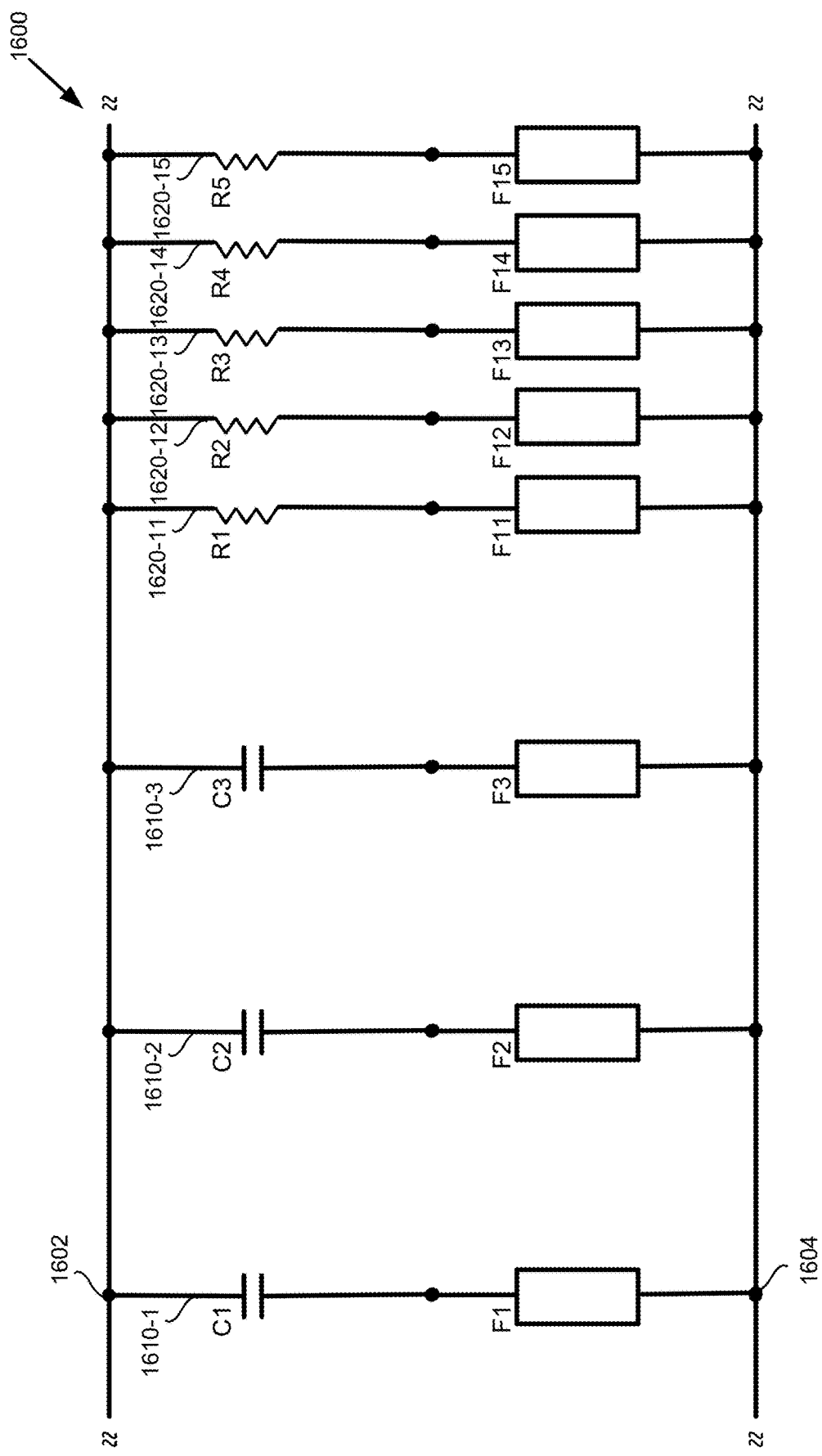
FIG. 16 illustrates electrical circuitry, in accordance with certain examples of the presently disclosed subject matter.

FIG. 16 illustrates a calibration circuit 1600 according to one or more examples of the present subject matter. Calibration circuit 1600 may be similar to calibration circuit 900, 1100, or 1400 and elements described with regards to one example may be included in the other example mutatis mutandis. Calibration circuit 1600 may include a plurality of electrical pathways 1610-1-1610-3 and 1620-11-1620-15 (referred to herein as "electrical pathways 1610 and 1620") connected between a first terminal 1602 and a second terminal 1604. The plurality of electrical pathways 1610, 1620 may include different types of electrical pathways. For example, each respective electrical pathway 1610 may include a capacitor C and each respective electrical pathway 1620 may include a resistor R. Calibration circuit 1600 may include fewer electrical elements than calibration circuit 1400. For example, calibration circuit 1600 may not include switches Q (or may include fewer switches Q). Calibration circuit 1100 may be relatively smaller and relatively less costly than calibration circuit 1400.

Figure 17:
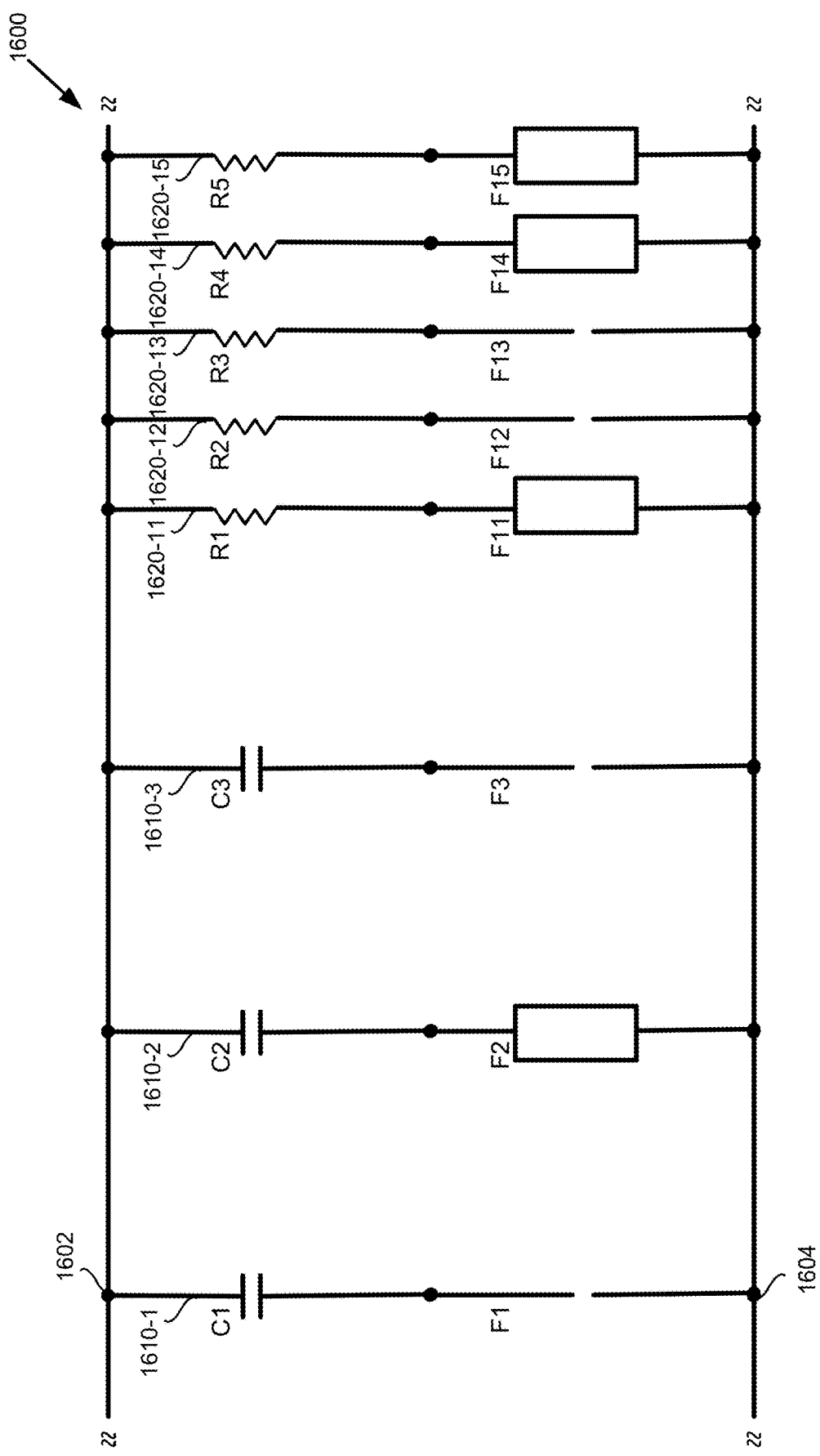
FIG. 17 illustrates electrical circuitry, in accordance with certain examples of the presently disclosed subject matter.

FIG. 17 illustrates circuit 1600 with a set calibration, according to one or more examples of the present subject matter. For example, the calibration may be set on calibration circuit 1600 (e.g., on calibration board 104 of CT clamp 100) based on a calibration code that was determined using calibration circuit 1400 (e.g., on simulation calibration board 804 of tester board 808). For example, the calibration code set in FIG. 17 may be "010 10011" (e.g., the same as in FIG. 15) which may correspond to pathways 1610-1, 1610-3, 1620-12, 1620-13 being open or non-operational (e.g., fuses F1, F3, F12, and F13 being burned) and pathways 1610-2, 1620-11, 1620-14, 1620-15 being closed or operational (e.g., fuses F2, F11, F14, and F15 not being burned).

Figure 18:
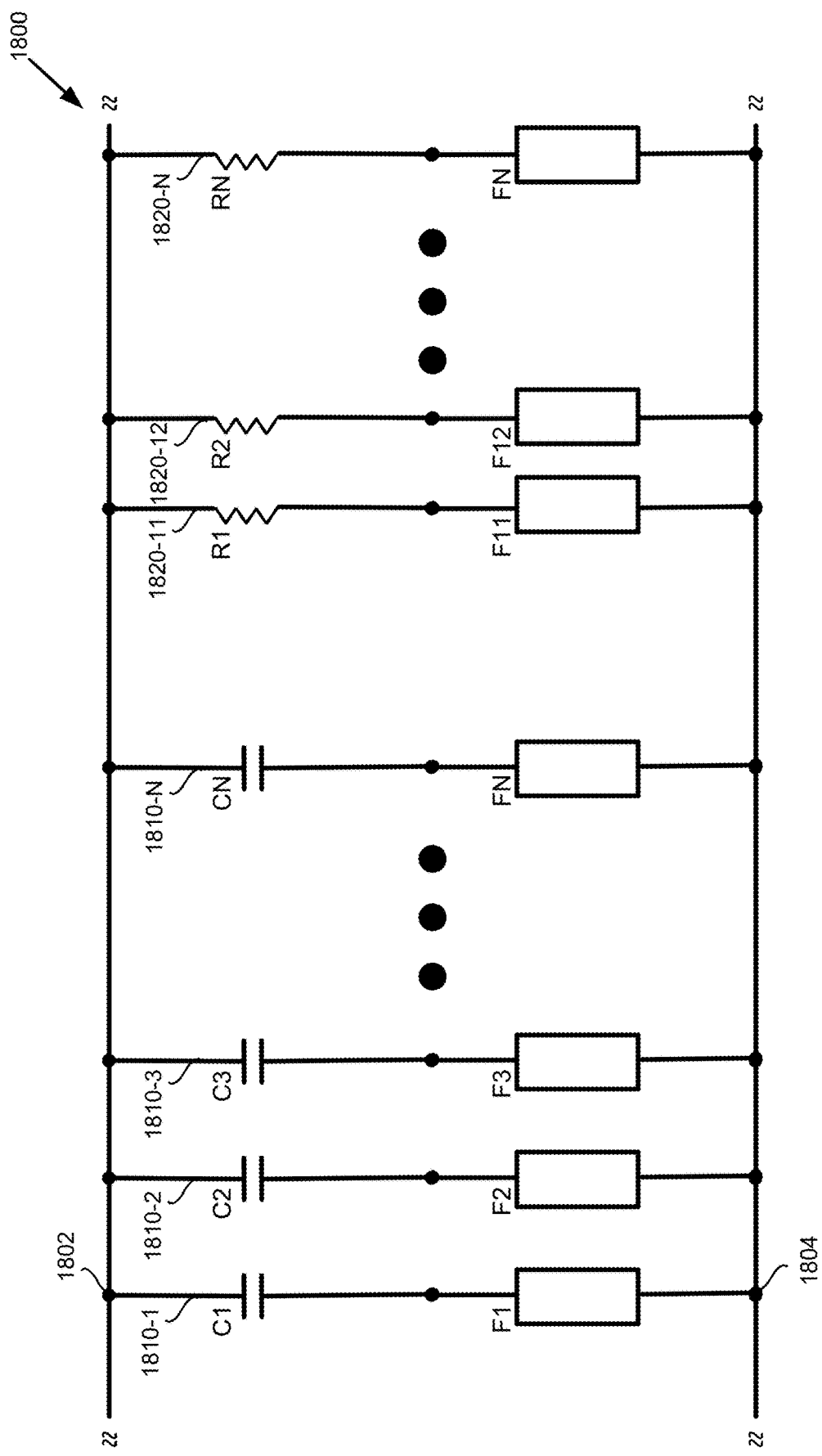
FIG. 18 illustrates electrical circuitry, in accordance with certain examples of the presently disclosed subject matter.

FIG. 18 illustrates a calibration circuit 1800 according to one or more examples of the present subject matter. Calibration circuit 1800 may be similar to calibration circuit 900, 1100, 1400, or 1600 and elements described with regards to one example may be included in the other example mutatis mutandis. Calibration circuit 1800 may include a plurality of electrical pathways 1810-1-1810-N and 1820-11-1820-N (referred to herein as "electrical pathways 1810 and 1820") connected between a first terminal 1802 and a second terminal 1804. Calibration circuit 1800 illustrates that even though other figures may show a specific number of elements, any appropriate number (e.g., to achieve a specified accuracy) of electrical pathways or electrical elements may be used in the calibration circuit (e.g., one or more electrical pathways each including one or more electrical element). As an example, calibration circuit 1800 may have a number N of electrical pathways 1810-N of a first type, wherein each electrical pathway 1810-N may include a number N of respective capacitors C and a number N of respective fuses F (and optionally a number N of respective switches Q [not shown]), where N is any appropriate number. As another example, calibration circuit 1800 may have a same or different number N of electrical pathways 1820-N of a different type, wherein each electrical pathway 1820-N may include a number N of respective resistors and a number N of respective fuses F (and optionally a number N of respective switches Q [not shown]), where N is any appropriate number.

Figure 19:
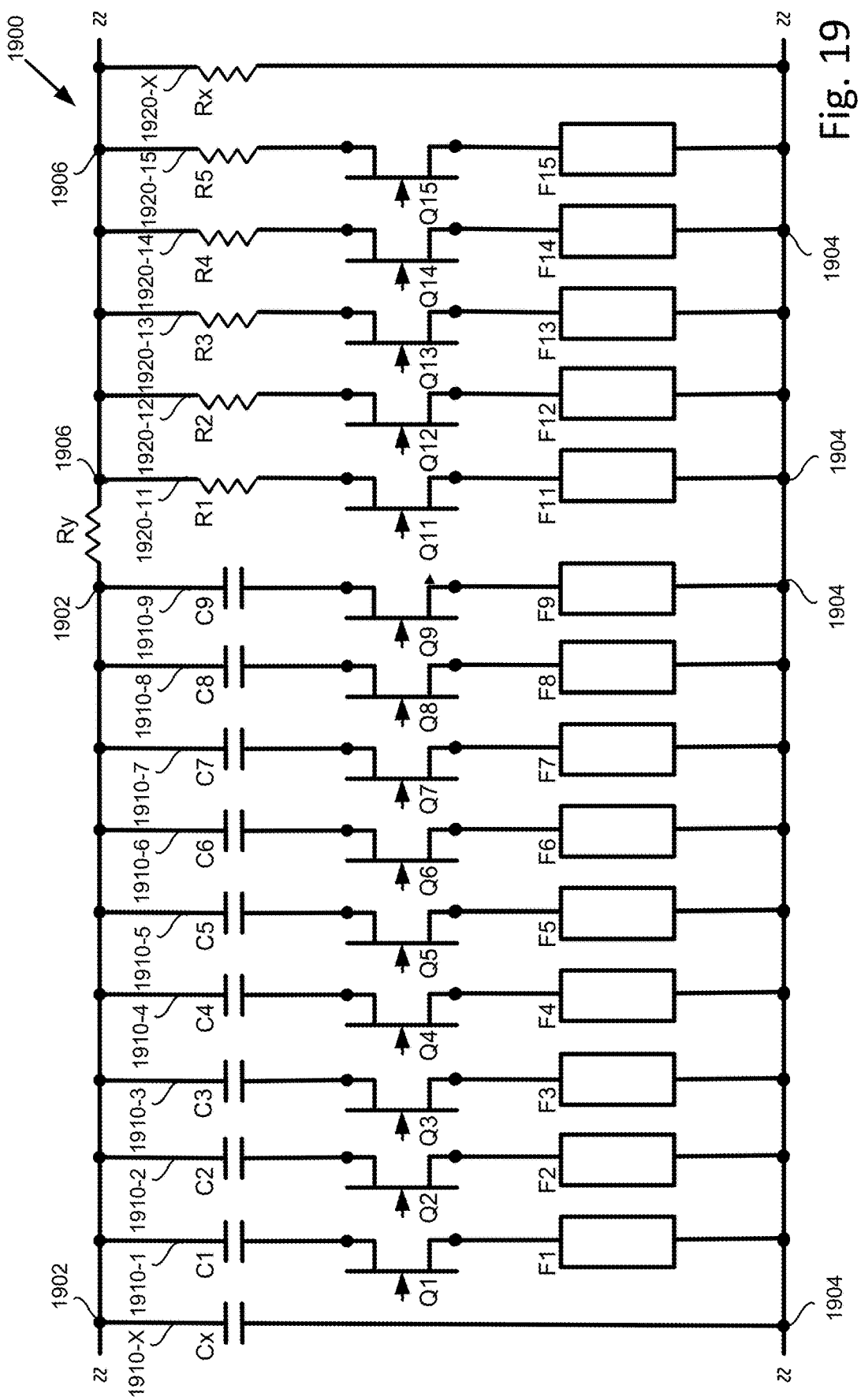
FIG. 19 illustrates electrical circuitry, in accordance with certain examples of the presently disclosed subject matter.

FIG. 19 illustrates a calibration circuit 1900 according to one or more examples of the present subject matter. Calibration circuit 1900 may be similar to calibration circuit 900, 1100, 1400, 1600, or 1800 and elements described with regards to one example may be included in the other example mutatis mutandis. Calibration circuit 1900 may include a plurality of electrical pathways 1910-1-1910-9 and 1920-11-1920-15 (referred to herein as "electrical pathways 1910 and 1920") connected between a first terminal 1902 and a second terminal 1904. Calibration circuit 1900 may include one or more additional electrical pathways 1910-X, 1920-X, and/or one or more separation electrical elements configured to separate between two or more electrical pathways (e.g., separation resistor Ry, for example, configured to decouple one or more parallel strings of electrical elements). Separation resistor Ry may be connected between terminal 1902 and terminal 1906. Terminal 1902 may be related to a first set of one or more electrical pathways 1910. Terminal 1906 may be related to another set of one or more electrical pathways 1920. Terminal 1904 may be related to each electrical pathway 1910, 1920.

The first set of electrical pathways 1910 may be connected between terminal 1902 and terminal 1904. The first set of electrical pathways 1910 may include one or more electrical pathways of the same types and/or different types. The first set of electrical pathways 1910 may include one or more additional electrical pathways 1910-X. The additional electrical pathway(s) 1910-X may include one or more electrical elements and not include one or more other electrical elements (e.g., it may omit one or more electrical elements for setting a calibration, such as a switch or a fuse that may be included in other electrical pathways of that set). For example, additional electrical pathway 1910-X may include one or more capacitors C and omit one or more switches Q and/or one or more fuses F. The other electrical pathways 1910-1-1910-9 may include the one or more electrical elements omitted from 1910-X (e.g., for setting a calibration). For example, the other electrical pathways 1910-1-1910-9 may each include a respective capacitor C, a respective switch Q, and a respective fuse F.

The other set of electrical pathways 1920 may be connected between terminal 1906 and terminal 1904. The other set of electrical pathways 1920 may include one or more electrical pathways of the same types and/or different types. The other set of electrical pathways 1920 may include one or more additional electrical pathways 1920-X. The additional electrical pathway(s) 1920-X may include one or more electrical elements and not include one or more other electrical elements (e.g., it may omit one or more electrical elements for setting a calibration, such as a switch or a fuse that may be included in other electrical pathways of that set). For example, additional electrical pathway 1920-X may include one or more resistors R and omit one or more switches Q and/or one or more fuses F. The other electrical pathways 1920-11-1920-15 may include the one or more electrical elements omitted from 1920-X (e.g., for setting a calibration). For example, the other electrical pathways 1920-11-1920-15 may each include a respective resistor R, a respective switch Q, and a respective fuse F.

Figure 20:
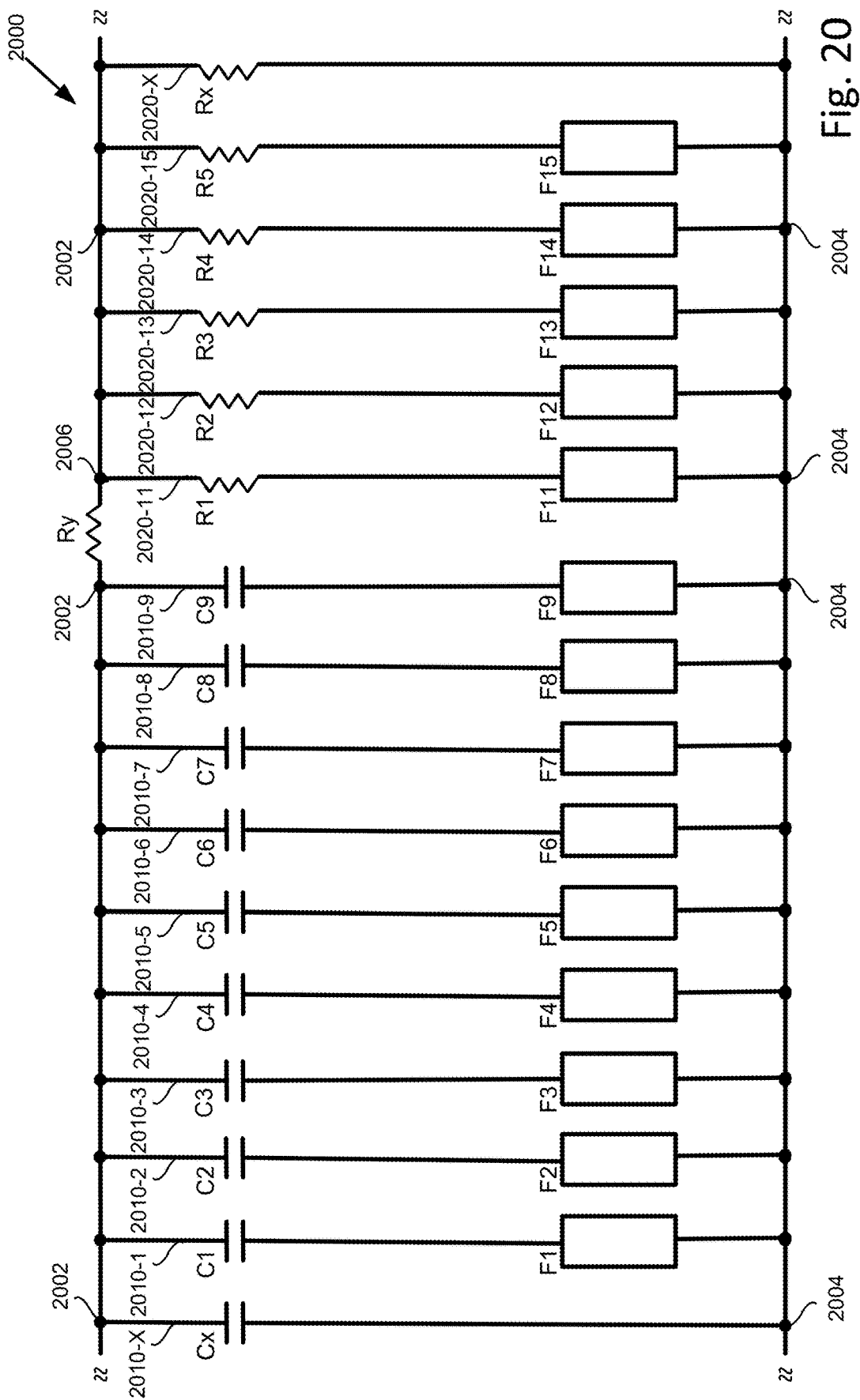
FIG. 20 illustrates electrical circuitry, in accordance with certain examples of the presently disclosed subject matter.

FIG. 20 illustrates a calibration circuit 2000 according to one or more examples of the present subject matter. Calibration circuit 2000 may be similar to calibration circuit 900, 1100, 1400, 1600, 1800, or 1900 and elements described with regards to one example may be included in the other example mutatis mutandis. Calibration circuit 2000 may include a first plurality of electrical pathways 2010 including an additional electrical pathway 2010-X connected between a first terminal 2002 and a second terminal 2004. Calibration circuit 2000 may also include another plurality of electrical pathways 2020 including an additional electrical pathway 2020-X connected between a third terminal 2006 and the second terminal 2004. Each plurality of electrical pathways 2010-1-2010-9 and 2020-11-2020-15 (referred to herein as "electrical pathways 2010 and 2020") may include different types of electrical pathways. For example, each respective electrical pathway 2010 may include a capacitor C and each respective electrical pathway 2020 may include a resistor R. Calibration circuit 2000 may include fewer electrical elements than calibration circuit 1900 (e.g., effecting manufacture and/or cost). For example, calibration circuit 2000 may not include switches Q (or may include fewer switches Q). Calibration circuit 2000 may be relatively smaller and relatively less costly than calibration circuit 1900. For example, calibration circuit 2000 may be located and used in a calibration board 104 in a CT clamp 100, and calibration circuit 1900 may be located and used in a calibration board 104 in a CT clamp 100 and/or a simulation calibration board 804 on a tester board 808.

In some examples, calibration circuit may have or be part of a ladder configuration (e.g., a full ladder configuration).

Figure 21:
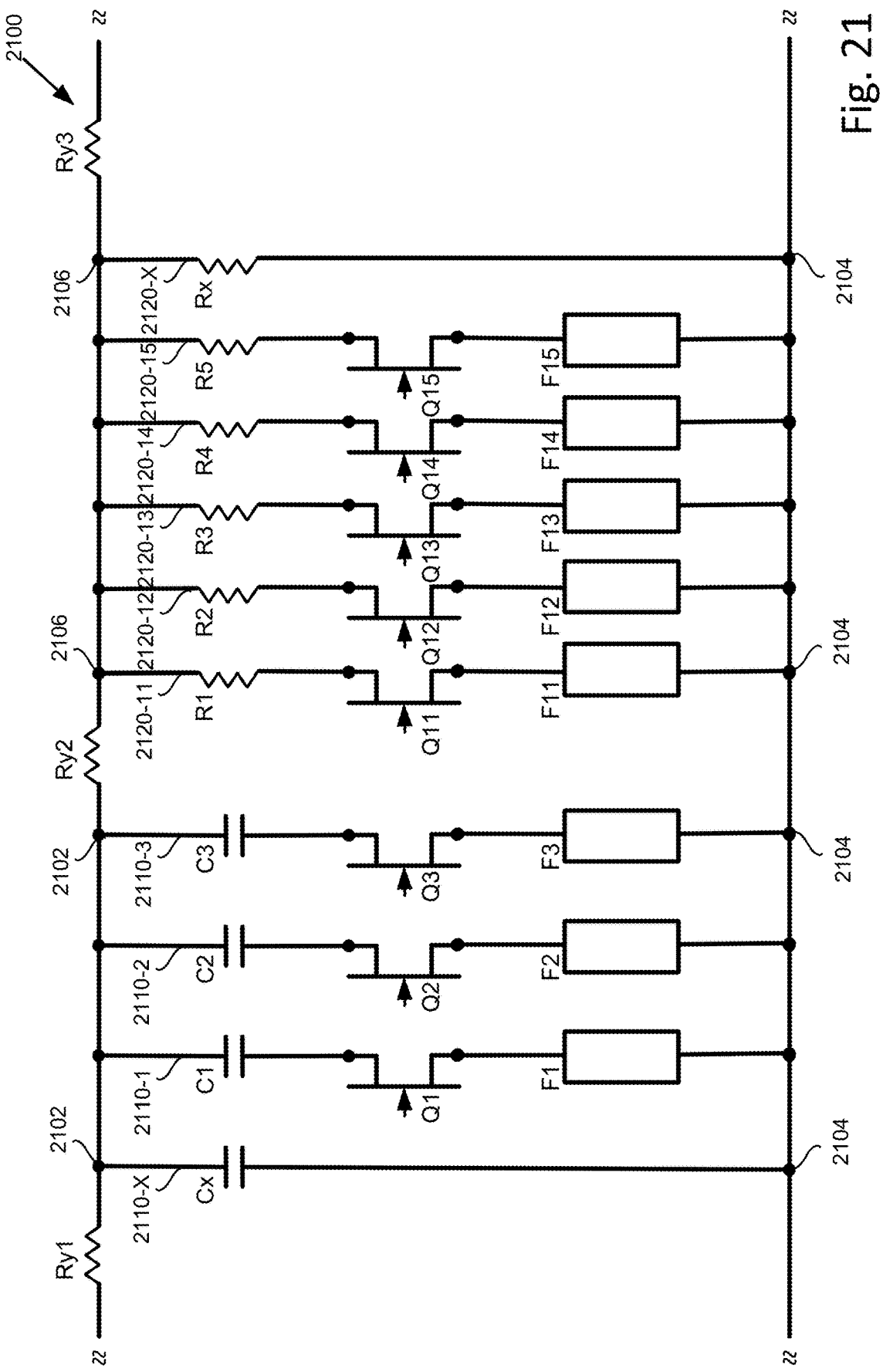
FIG. 21 illustrates electrical circuitry, in accordance with certain examples of the presently disclosed subject matter.

FIG. 21 illustrates a calibration circuit 2100 according to one or more examples of the present subject matter. Calibration circuit 2100 may be similar to calibration circuit 900, 1100, 1400, 1600, 1800, 1900, or 2000 and elements described with regards to one example may be included in the other example mutatis mutandis. Calibration circuit 2100 may include a plurality of separation electrical elements (e.g., separation resistors Ry), each separation electrical element of the plurality of separation electrical elements is configured to separate between at least one electrical pathway and at least one other electrical element or electrical pathway. Each separation resistor Ry includes at least one terminal related to at least one set of electrical pathways. For example, separation resistor Ry1 is connected to terminal 2102 which is related to electrical pathways 2110. Ry1 also includes another terminal related to another electrical element or electrical pathway (not shown). As another example, separation resistor Ry2 is connected to terminal 2102 which is related to electrical pathways 2110. Ry2 is connected to terminal 2102 which is related to electrical pathways 2110. As another example, separation resistor Ry3 is connected to terminal 2106 which is related to electrical pathways 2120. Ry3 also includes another terminal related to another electrical element or electrical pathway (not shown).

Figure 22:
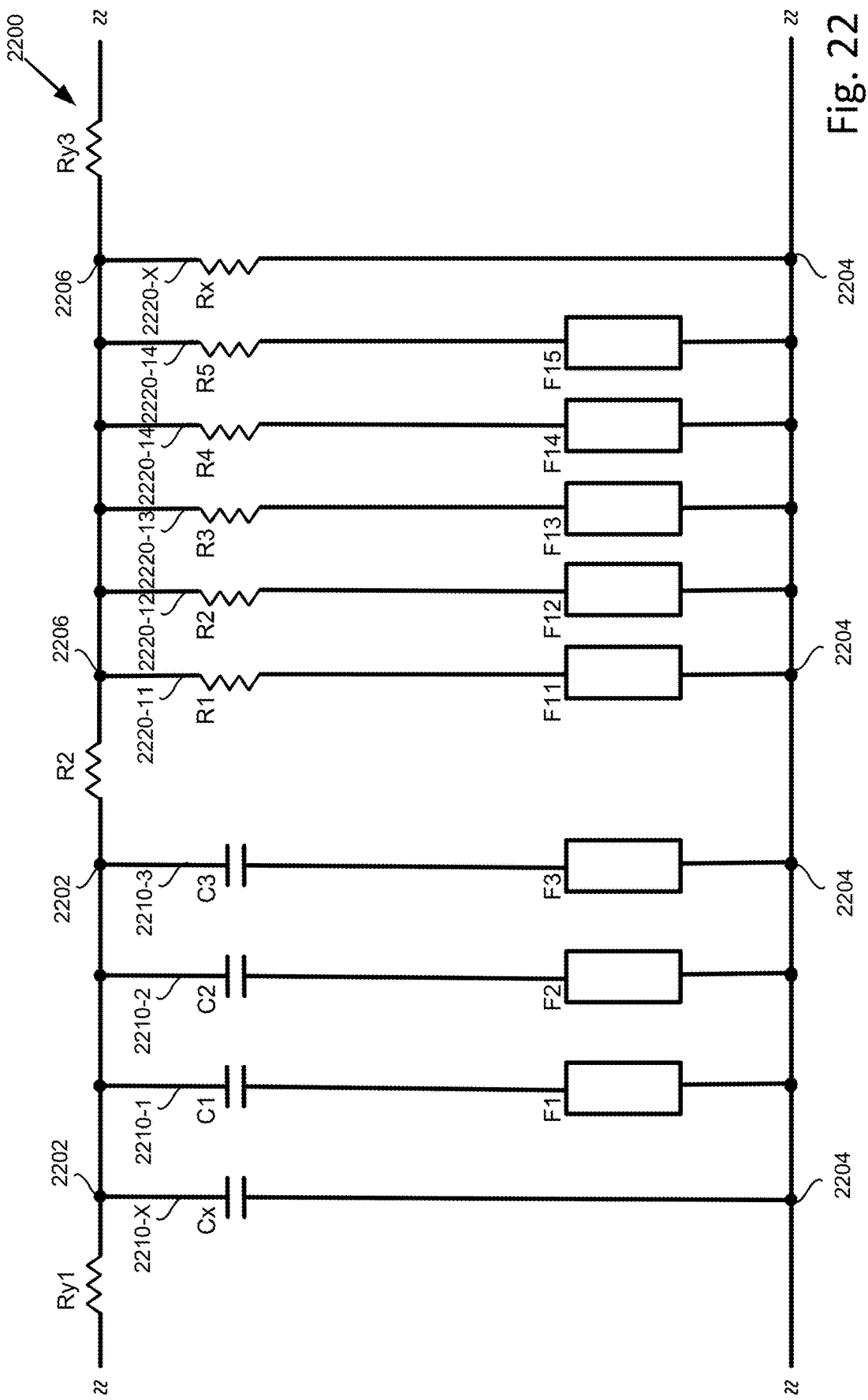
FIG. 22 illustrates electrical circuitry, in accordance with certain examples of the presently disclosed subject matter.

FIG. 22 illustrates a calibration circuit 2200 according to examples of the present subject matter. Calibration circuit 2200 may be similar to calibration circuit 900, 1100, 1400, 1600, 1800, 1900, 2000, or 2100 and elements described with regards to one example may be included in the other example mutatis mutandis. Calibration circuit 2200 may include a first plurality of electrical pathways 2210 connected between a first terminal 2202 and a second terminal 2204, and another plurality of electrical pathways 2220 connected between a third terminal 2206 and the second terminal 2204. Calibration circuit 2000 may also include a plurality of separation resistors Ry1, Ry2, Ry3. Calibration circuit 2200 may include fewer electrical elements than calibration circuit 2100. For example, calibration circuit 2200 may not include switches Q (or may include fewer switches Q). Calibration circuit 2200 may be relatively smaller and relatively less costly than calibration circuit 2100. For example, calibration circuit 2200 may be located and used in a calibration board 104 in a CT clamp 100, and calibration circuit 2100 may be located and used in a calibration board 104 in a CT clamp 100 and/or a simulation calibration board 804 on a tester board 808.

Figure 23:
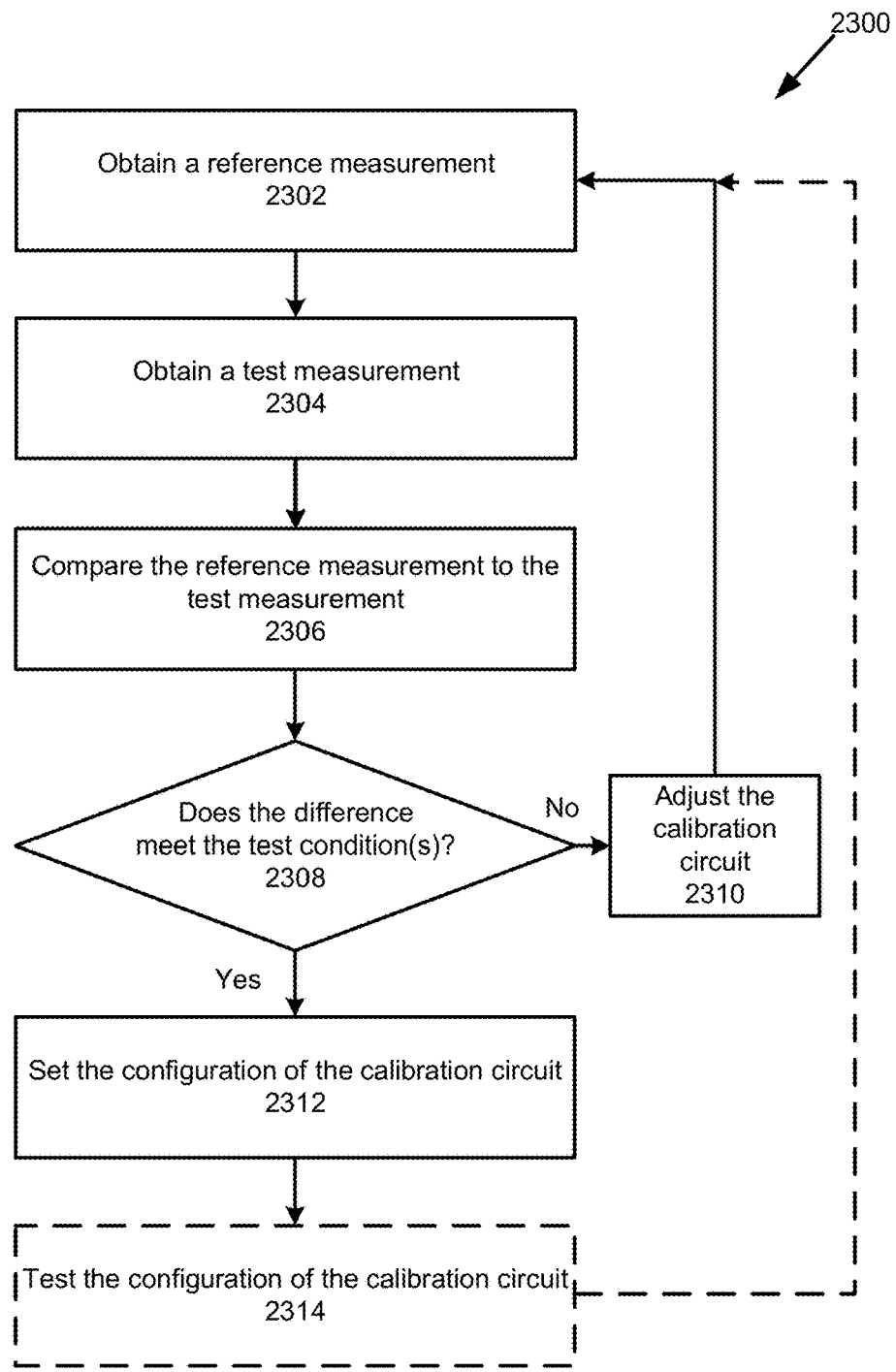
FIG. 23 illustrates a flow chart of a method, in accordance with certain examples of the presently disclosed subject matter.

FIG. 23 illustrates a flow chart 2300 of a method for calibration, according to one or more examples of the present subject matter.

In step 2302, a reference measurement may be obtained. This step may be performed using one or more reference current sensors 706 and/or controllers 710 of the calibration system. The reference measurement may relate to a current (e.g., an AC current) in one or more conductors. The reference measurement may relate to one or more electrical parameters associated with an electrical current (e.g., phase, amplitude, gain, voltage, etc.).

In step 2304, a test measurement may be obtained. This step may be performed using one or more CT clamps 100 and/or one or more controllers 710 of the calibration system. The test measurement may relate to the same current (e.g., an AC current) in one or more conductors that is being measured (e.g., at substantially the same time) by the reference current sensor 706. The test measurement may relate to one or more electrical parameters associated with an electrical current (e.g., phase, amplitude, gain, voltage, etc.).

In step 2306, the reference measurement and the test measurement may be compared. This step may be performed using one or more differential amplifiers (e.g., differential amplifiers 712 and/or 714) and/or one or more controllers 710 of the calibration system. For example, each differential amplifier may output a proportional value related to the respective input (e.g., either the reference current or the test current). The proportional values may be compared (e.g., by the one or more controllers 710) to determine a difference between the reference measurement and the test measurement. The difference may relate to one or more electrical parameters associated with an electrical current (e.g., phase, amplitude, gain, voltage, etc.).

In step 2308, a decision may be made whether the difference meets one or more test conditions. This step may be performed using one or more controllers 710 of the calibration system. For example, the one or more test conditions may be related to a threshold (e.g., an acceptable error threshold between the reference current and the test current, such as whether the difference is less than a certain amount or percentage). For example, a test condition related to phase may be that the determined phase difference between the reference current and the test current is less than 1 degree or less than 0.5 degrees. For example, a test condition related to amplitude or gain may be that the determined amplitude or gain difference between the reference current and the test current is less than 1% or less than 0.5%. In some examples, a plurality of test conditions may need to be met. For example, the test conditions may be determined simultaneously and/or subsequently. As an example, during calibration, first a test condition related to phase may have to be met and then a test condition related to amplitude or gain may have to be met (or vice versa).

If in step 2308 the decision is that the difference does not meet the one or more test conditions, then the process 2300 may proceed to step 2310 before repeating steps 2302-2308.

In step 2310, the calibration circuit may be adjusted (e.g., the configuration of the calibration circuit may be changed, for example, by affecting one or more electrical pathways). This step may be performed using one or more controllers 710 and/or one or more calibration board 104 or simulation calibration board 804 of the calibration system. The calibration circuit may be adjusted by opening or closing one or more electrical pathways of the calibration circuit (e.g., related to a different calibration code than a prior calibration code that was previously tested). The electrical pathway(s) may be opened or closed using one or more switches Q of the calibration circuit. For example, if the calibration code "110 111" did not result in a determination in step 2308 that met the one or more test conditions, then the calibration circuit may be adjusted to test the calibration code "100 111". As an example, different electrical pathways (e.g., with different electrical elements) may be used to adjust the measurement of different electrical parameters. For example, an electrical pathway with a respective capacitor C may be used to adjust a measurement related to phase. As another example, an electrical pathway with a respective resistor R may be used to adjust a measurement related to amplitude.

If in step 2308 the decision is that the difference does meet the one or more test conditions, then the process 2300 may proceed to step 2312.

In step 2312, the configuration of the calibration circuit may be set (e.g., the configuration of the calibration circuit may be locked in, such as by affecting one or more electrical pathways). This step may be performed using one or more controllers 710 and/or one or more calibration board 104 of the calibration system. The calibration circuit may be set by opening or closing one or more electrical pathways of the calibration circuit (e.g., permanently opening one or more electrical pathways, for example, related to a calibration code that passed the determination of step 2308). The electrical pathway(s) may be opened using one or more fuses F of the calibration circuit. For example, if the calibration code "100 111" resulted in a determination in step 2308 that met the one or more test conditions, then the calibration circuit may be set according to the calibration code "100 111". As an example, the calibration code may be set by burning one or more fuses F of the calibration circuit to permanently open one or more corresponding electrical pathways to set the configuration of the calibration circuit. For example, when the determination is made that the difference meets the one or more test conditions, then the one or more controller 710 may provide one or more instructions to the power source 740 which may provide power (e.g., voltage and current) to each of the appropriate fuses that is sufficient to burn that respective fuse and open the corresponding electrical pathway, thereby setting the calibration code in the calibration circuit.

Optionally, in step 2314 the configuration of the calibration circuit may be tested (e.g., the calibration circuit may be tested to verify that the calibration code was locked in properly, for example, that the fuses were sufficiently burned or one or more switches were sufficiently opened or closed). This step may be performed using one or more controllers 710, one or more current sensors 706M, and/or one or more calibration board 104 of the calibration system. The calibration circuit may be tested by determining whether or not the calibration circuit meets the one or more test conditions after the calibration has been set in step 2312. If the determination is that the configuration of the calibration circuit was not set properly, then one or more appropriate steps may be taken (e.g., to properly set the configuration of the calibration circuit, e.g., the one or more fuses F may be attempted to be burned again, in accordance with the calibration code).

Figure 24:
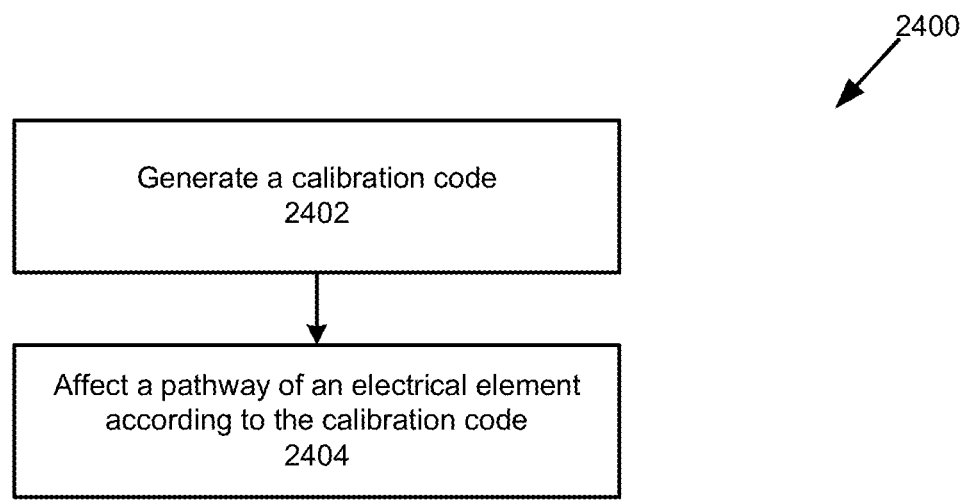
FIG. 24 illustrates a flow chart of a method, in accordance with certain examples of the presently disclosed subject matter.

FIG. 24 illustrates a flow chart 2400 of a method for adjusting calibration, according to one or more examples of the present subject matter.

The steps of flow chart 2400 may be part of step 2310 of FIG. 23.

In step 2302, a calibration code may be generated. This step may be performed using one or more controllers 710 of the calibration system. The calibration code may be generated based on or in response to a previously tested calibration code and/or may be related to one or more previous measurements (e.g., one or more reference measurements, one or more test measurements, one or more differences between one or more previous measurements, and/or one or more differences between a reference measurement and a test measurement).

In step 2304, one or more electrical pathway related to one or more electrical element may be affected according to the calibration code generated in step 2302. This step may be performed using one or more calibration board 104 and/or one or more simulation calibration board 804 of the calibration system. The electrical pathway may be located on a calibration board 104 and/or one or more simulation calibration board 804, and it may be non-permanently affected according to the calibration code. For example, one or more switches Q may be activated or deactivated according to the generated calibration code in order to change the configuration of the calibration circuit and adjust the measurement of the calibration circuit (e.g., in order to bring the test measurement closer in value to the reference measurement, such as for meeting one or more test conditions and/or calibrating the current transformer to be accurate within a certain threshold).

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:
1. An apparatus comprising:
a calibration circuit configured to adjust a measurement of an alternating current, the calibration circuit comprising:
a first terminal and a second terminal; and
a plurality of electrical pathways between the first terminal and the second terminal,
each of the plurality of electrical pathways comprising electrical elements including:
a fuse;
a switch; and
an additional electrical element;

wherein:
the fuse, the switch, and the additional electrical element are connected in series between the first terminal and the second terminal;
one or more of the plurality of electrical pathways is set in a closed circuit configuration when the respective switch is closed and the respective fuse is intact; and
one or more of the plurality of electrical pathways is set in an open circuit configuration when the respective switch is open or the respective fuse is burned.

2. The apparatus of claim 1, wherein the additional electrical element is a resistor.

3. The apparatus of claim 1, wherein the additional electrical element is a capacitor.

4. The apparatus of claim 1, further comprising:
a third terminal; and
a second plurality of electrical pathways between the third terminal and the second terminal,
each of the second plurality of electrical pathways comprising other electrical elements including:
another fuse;
another switch; and
another additional electrical element;
wherein the another fuse, the another switch, and the another additional electrical element are connected in series between the third terminal and the second terminal.

5. The apparatus of claim 4, wherein the another additional electrical element is a resistor.

6. The apparatus of claim 4, wherein each of the second plurality of electrical pathways further comprises a capacitor.

7. The apparatus of claim 4, further comprising: a separation electrical element connected between the first terminal and the third terminal, such that there is a separation between the plurality of electrical pathways and the second plurality of electrical pathways.

8. The apparatus of claim 7, wherein the separation electrical element is a resistor.

9. The apparatus of claim 4, wherein the second plurality of electrical pathways are located in a separate housing than the plurality of electrical pathways.

10. The apparatus of claim 1, wherein the switch is configured to be opened and closed to reversibly adjust the measurement during a calibration mode of operation.

11. The apparatus of claim 1, wherein the fuse is configured to be intact during a calibration mode of operation.

12. The apparatus of claim 1, wherein the fuse is configured to be burned open to set a calibration configuration during a set calibration mode of operation.

13. The apparatus of claim 1, further comprising a controller configured to control the calibration circuit in a calibration mode of operation.

14. The apparatus of claim 1, further comprising a controller configured to control the calibration circuit in a set calibration mode of operation.

15. A method comprising:
reversibly opening at least one electrical pathway of a plurality of electrical pathways between two terminals of a calibration circuit,
wherein each of the plurality of electrical pathways comprises a fuse, a switch, and an electrical element connected in series between the two terminals, and
wherein reversibly opening the at least one electrical pathway comprises opening the switch of the at least one electrical pathway;
obtaining a reference measurement from a reference sensor;
obtaining an additional measurement from an additional sensor;
determining, based on comparing the reference measurement to the additional measurement, a difference between the reference measurement and the additional measurement;
determining whether the difference between the reference measurement and the additional measurement meets one or more conditions; and
setting, based on determining that the difference meets the one or more conditions, a configuration of the at least one electrical pathway by irreversibly opening the at least one electrical pathway, including burning the fuse of the at least one electrical pathway.

16. The method of claim 15, wherein determining whether the difference meets the one or more conditions comprises comparing the difference to one or more previously determined differences between other measurements.

17. The method of claim 15, wherein determining whether the difference meets the one or more conditions comprises comparing the difference to a threshold.

18. The method of claim 15, wherein setting the configuration further comprises generating a calibration code and burning the fuse based on the calibration code.

19. The method of claim 15, wherein each of the plurality of electrical pathways further comprises a resistor.

20. The method of claim 15, wherein each of the plurality of electrical pathways further comprises a capacitor.

* * * * *